(12) United States Patent
Kim et al.

(10) Patent No.: US 9,706,668 B2
(45) Date of Patent: Jul. 11, 2017

(54) PRINTED CIRCUIT BOARD, ELECTRONIC MODULE AND METHOD OF MANUFACTURING THE SAME

(71) Applicant: Samsung Electro-Mechanics Co., Ltd., Suwon-si (KR)

(72) Inventors: Da-Hee Kim, Seoul (KR); Sung-Won Jeong, Changwon-si (KR); Gi-Ho Han, Hwaseong-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/921,633

(22) Filed: Oct. 23, 2015

(65) Prior Publication Data
US 2016/0120060 A1 Apr. 28, 2016

(30) Foreign Application Priority Data

Oct. 24, 2014 (KR) .................. 10-2014-0144735
Apr. 10, 2015 (KR) .................. 10-2015-0050828

(51) Int. Cl.
*H05K 7/20* (2006.01)
*H05K 3/40* (2006.01)
(Continued)

(52) U.S. Cl.
CPC ......... *H05K 3/4038* (2013.01); *H05K 1/0204* (2013.01); *H01L 2224/16225* (2013.01); *H01L 2224/48091* (2013.01); *H01L 2224/48227* (2013.01); *H01L 2924/15311* (2013.01); *H05K 1/0206* (2013.01); *H05K 3/0035* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS

2006/0246621 A1* 11/2006 Crippen .................. H01L 23/36 438/106
2008/0224257 A1* 9/2008 Mori ................. H01L 21/76283 257/507

(Continued)

FOREIGN PATENT DOCUMENTS

JP 2005-333050 A 12/2005
KR 10-2012-0117456 A 10/2012

OTHER PUBLICATIONS

Korean Office Action issued on Jan. 13, 2017 in counterpart Korean Patent Application No. 10-2015-0050828 (7 pages, with partial English translation).

*Primary Examiner* — Anthony Haughton
*Assistant Examiner* — Razmeen Gafur
(74) *Attorney, Agent, or Firm* — NSIP Law

(57) ABSTRACT

A printed circuit board, an electronic module and a method of manufacturing the printed circuit board are provided. The printed circuit board includes a plurality of insulation layers, metal layers formed on the plurality of insulation layers, a via formed for interlayer electrical connection of the metal layers, a trench penetrating the insulation layers, and a heat-transfer structure formed in the trench.

22 Claims, 18 Drawing Sheets

(51) Int. Cl.
*H05K 1/02* (2006.01)
*H01L 23/473* (2006.01)
*H05K 3/00* (2006.01)
*H05K 3/42* (2006.01)
*H05K 3/46* (2006.01)

(52) U.S. Cl.
CPC ........... *H05K 3/0097* (2013.01); *H05K 3/423* (2013.01); *H05K 3/4614* (2013.01); *H05K 3/4682* (2013.01); *H05K 2201/0367* (2013.01); *H05K 2201/0379* (2013.01); *H05K 2201/0391* (2013.01); *H05K 2203/0723* (2013.01); *H05K 2203/1476* (2013.01); *H05K 2203/1536* (2013.01)

(58) Field of Classification Search
USPC ... 257/712–722, E23.088; 24/453, 458–459; 454/184; 312/236
See application file for complete search history.

(56) References Cited

U.S. PATENT DOCUMENTS

| | | | | |
|---|---|---|---|---|
| 2009/0045487 | A1* | 2/2009 | Jung | H01L 21/76898 257/621 |
| 2009/0294938 | A1* | 12/2009 | Chen | H01L 21/563 257/676 |
| 2009/0296349 | A1* | 12/2009 | Suzuki | H05K 1/0206 361/705 |
| 2009/0321911 | A1* | 12/2009 | Son | H01L 21/561 257/686 |
| 2010/0013102 | A1* | 1/2010 | Tay | H01L 23/3677 257/774 |
| 2010/0290191 | A1* | 11/2010 | Lin | H01L 23/49816 361/704 |
| 2011/0193214 | A1* | 8/2011 | Paek | H01L 25/0657 257/686 |
| 2011/0242765 | A1* | 10/2011 | Lin | H01L 23/3677 361/709 |
| 2011/0272824 | A1* | 11/2011 | Pagaila | H01L 21/565 257/777 |
| 2011/0278705 | A1* | 11/2011 | Oh | H01L 21/561 257/659 |
| 2011/0278717 | A1* | 11/2011 | Pagaila | H01L 21/568 257/737 |
| 2011/0278721 | A1* | 11/2011 | Choi | H01L 24/29 257/737 |
| 2012/0069526 | A1* | 3/2012 | Tissot | H05K 7/20809 361/720 |
| 2012/0161190 | A1* | 6/2012 | Yao | H01L 23/3677 257/99 |
| 2012/0171814 | A1* | 7/2012 | Choi | H01L 21/561 438/107 |
| 2012/0175783 | A1* | 7/2012 | Suh | H01L 21/76898 257/774 |
| 2012/0206882 | A1* | 8/2012 | Mohammed | H01L 23/373 361/710 |
| 2012/0248627 | A1* | 10/2012 | Gaul | H01L 23/3677 257/774 |
| 2013/0161811 | A1* | 6/2013 | Yang | H01L 23/3677 257/737 |
| 2013/0176683 | A1* | 7/2013 | Chao | H01L 23/3677 361/719 |
| 2013/0228911 | A1* | 9/2013 | Manusharow | H01L 23/36 257/690 |
| 2013/0280864 | A1* | 10/2013 | Bachman | H01L 23/3677 438/122 |
| 2013/0319737 | A1* | 12/2013 | Hurwitz | H01L 23/3677 174/257 |

* cited by examiner

PRINTED CIRCUIT BOARD, ELECTRONIC MODULE AND METHOD OF MANUFACTURING THE SAME

CROSS-REFERENCE TO RELATED APPLICATIONS

This application claims the benefit under 35 USC 119(a) of Korean Patent Application Nos. 10-2015-0050828 and 10-2014-0144735, filed on Apr. 10, 2015, and Oct. 24, 2014, respectively, in the Korean Intellectual Property Office, the entire disclosures of which are incorporated herein by reference for all purposes.

BACKGROUND

1. Field

The following description relates to a printed circuit board, an electronic module, and a method of manufacturing the printed circuit board and the electronic module.

2. Description of Related Art

With the recent increase in product functionalities of electronic devices and the concurrent minimization of product dimensions, there exists a growing demand for producing highly integrated and thin electronic components. Thus, the development of a printed circuit board in which fine patterns are applied without compromising the heat-dissipating properties is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a plurality of insulation layers, metal layers formed on the plurality of insulation layers, a via formed for interlayer electrical connection of the metal layers, a trench penetrating the insulation layers, and a heat-transfer structure formed in the trench.

The heat-transfer structure may have a rod shape.

The plurality of insulation layers may each include a heat-transfer structure.

The heat-transfer structure may include at least one core and an outer layer surrounding the at least one core.

The at least one core and the outer layer may each include at least one plating layer.

A volume of the heat-transfer structure may be greater than a volume of the via.

A lateral surface of the heat-transfer structure may be tilted so that the heat-transfer structure has a tapered shape.

In another general aspect, an electronic module includes a printed circuit board comprising a plurality of insulation layers, metal layers formed on the plurality of insulation layers, a via formed for interlayer electrical connection of the metal layers, a trench penetrating the insulation layers, and a heat-transfer structure formed in the trench, and a device mounted on the printed circuit board.

The heat-transfer structure may have a rod shape.

The device may be mounted on the printed circuit board by being thermally connected with the heat-transfer structure.

The plurality of insulation layers may each include a heat-transfer structure.

The heat-transfer structure may include at least one core, and an outer layer may surround outer surfaces of the at least one core.

In another general aspect, an electronic module includes a printed circuit board including a plurality of insulation layers, metal layers formed on the plurality of insulation layers, a via formed for interlayer electrical connection of the metal layers, a trench penetrating the insulation layers, and a heat-transfer structure formed in the trench, a device mounted on the printed circuit board, and a main board on which the printed circuit board having the device mounted thereon is installed.

The heat-transfer structure may have a rod shape.

The device may be mounted on the printed circuit board by being thermally connected with the heat-transfer structure.

The plurality of insulation layers may each include a heat-transfer structure.

The heat-transfer structure may include at least one core and an outer layer surrounding the at least one core.

In yet another general aspect, a method of manufacturing a printed circuit board involves obtaining an insulation layer, forming a via hole and a trench in the insulation layer, forming a heat-transfer structure in the trench and a via in the via hole, and forming a metal layer on the insulation layer.

The obtaining of the insulation layer, the forming of the via hole and the trench, and the forming of the heat-transfer structure and the via may be repeated such that each insulation layer includes a heat-transfer structure.

The forming of the via hole and the trench may involve forming a rod-shaped opening in the insulation layer, and the via may be formed by filling a first plating layer in the via hole. The trench may be formed in the insulation layer such that an outer surface of the first plating layer is exposed, and the heat-transfer structure may be formed by filling a second plating layer in the trench.

A pattern having a rod shape opening for forming a core may be formed, and the insulation layer may be laminated in such a way that the pattern is embedded therein. The via may be formed by filling a first plating layer in the via hole. The trench having a rod shape may be formed in the insulation layer such that an outer surface of the pattern for core is exposed. The heat-transfer structure may be formed by filling a second plating layer in the trench.

The forming of the via hole and the trench may involve forming a rod-shaped trench in the insulation layer, and the via and the heat-transfer structure may be formed by forming two or more layers of patterned plating layers in the via hole and within the rod-shaped trench.

In yet another general aspect, a method of manufacturing a printed circuit board involves forming a via and a core of a heat-transfer structure in an insulation layer, removing a portion of the insulation layer surrounding the core to form a trench, and filling the trench with a heat conducting material to form the heat-transfer structure.

The removing of the portion of the insulation layer may involve removing the portion of the insulation layer surrounding the core by laser drilling as to expose an outer surface of the core.

The heat-transfer structure may have an elongated shape.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
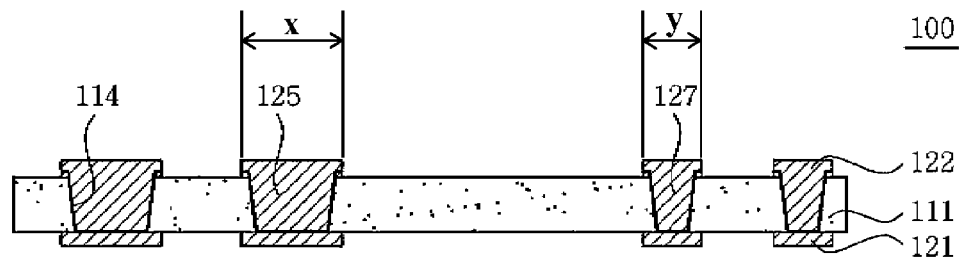
FIG. 1 is a cross-sectional view illustrating an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

In the following disclosure, the term "rod shape" refers to various elongated three-dimensional shapes.

To increase product functionalities of electronic devices while minimizing the dimension of the electronic devices, fine patterns are formed in printed circuit boards. When the density of patterns formed within a printed circuit board is increased, the heat generated by the patterns may also increase within the printed circuit board. To dissipate the heat, the use of a heat pad in an example of an integrated electronic component is proposed in U.S. Patent Publication No. 2011/0069448. However, when such a heat pad is formed on a printed circuit board to dissipate heat, a thermal stress resulting from juxtaposing the heat pad next to the insulation material of the printed circuit board may cause dimples to appear on the circuit board surface, causing defects and increasing manufacturing costs. Thus, it is desirable to develop a technology that permits the formation of a printed circuit board with fine patterns, efficiently dissipates heat, and maintains the reliability of the component.

Hereinafter, certain embodiments of the present disclosure will be described in detail with reference to the accompanying drawings.

Printed Circuit Board

FIG. 1 illustrates a cross-sectional view of an example of a printed circuit board 100.

Referring to FIG. 1, the printed circuit board 100 includes a first metal layer 121 and a second metal layer 122 formed on either surface of an insulation layer 111, a via and a heat-transfer structure 125 formed in a trench 114.

The insulation layer 111 may be made of any resin used as an insulation material for common printed circuit boards; for example, the insulating layer 111 may be made of a thermosetting resin, thermoplastic resin, and/or photosensitive resin. The resin used for forming the insulation layer 111 may further include a stiffener such as glass fiber or inorganic filler impregnated therein. For instance, the insulation layer 111 may be made of a prepreg, an ajinomoto build-up film (ABF) or resin such as flame retardant 4 (FR-4) and bismaleimide triazine (BT).

In this example, the metal layers 121, 122 are each made of a metal suitable for forming a circuit, such as aluminum or copper. However, in another example, other conductive material with suitable conductivity may be used to form the metal layers 121, 122.

The via 127 and the heat-transfer structure 125 may each include a seed layer, such as an electroless plating layer, and at least one electrolytic plating layer. The via 127 and the heat-transfer structure 125 may be made of a metal such as copper or aluminum.

The via 127 may have the shape of a conventional signal via formed for an interlayer electrical connection of circuit patterns. For example, the via 127 may be formed using a laser drilling technique such that the via hole has a width or a diameter of approximately 30 to 100 μm and the via hole penetrates through the insulation layer 111 with a circular shape in a plan view of the printed circuit board 100. The lateral sides of the via 127 may be tilted such that the via 127 has a truncated cone shape within the insulation layer 111.

The heat-transfer structure 125 is disposed within a trench 114 having a rod shape in a plan view of the printed circuit board 100. The trench 114 penetrates through the insulation layer 111. The volume of the heat-transfer structure 125 is greater than the volume of the via 127. In the cross-sectional view illustrated in FIG. 1, a width x of the trench 114 is further greater than the diameter or with y of the via 127. For example, a heat-transfer structure 125 may have a width x that is 1.5 to 4 times as wide as a width y of the via 127. However, the present disclosure is not limited thereto; in another example, the width of the heat-transfer structure 125 may be similar to the width of the via 127 while the heat-transfer structure 125 has an elongated rod shape.

The rod-shape trench 125 is not limited to having a polyhedronal shape such as a rectangular prism shape, a cuboid shape, a tapered quadrilateral prism shape, a truncated quadrilateral pyramidal shape and the like. Rather, the trench 125 may have a shape that involves curved surfaces such as an elongated, truncated cone shape, or various other three-dimensional shapes. In one example, a heat-transfer structure 425 may have an elongated rectangular prism shape with rounded corners.

By forming the heat-transfer structures 125 to have rod shapes, it is possible to dispose the heat-transfer structures 125 having a sufficiently large volume to dissipate heat at various locations throughout the printed circuit board 100 while avoiding areas where circuit patterns and vias are concentrated.

The heat-transfer structure 125 may have an elongated cylinder shape, a polyhedral shape such as a rectangular prism shape with an elongated rectangular base, or a variety of amorphous three-dimensional shapes.

The rod-shaped heat-transfer structure 125 may serve as a power source or a ground, depending on its design.

According to one example, a device is first connected to the heat-transfer structure 125, and then is installed on or embedded in the printed circuit board 100, or is disposed at a location where the device overlaps at least partially with the heat-transfer structure 125.

As a result, heat generated from the device may be displaced to an outside of the printed circuit board 100 efficiently through the heat-transfer structure 125.

Figure 2:
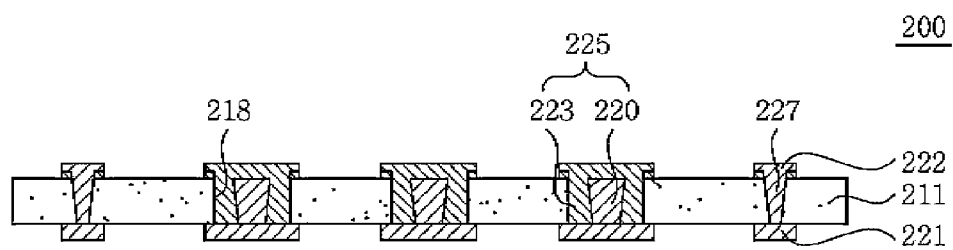
FIG. 2 is cross-sectional view illustrating another example of a printed circuit board.

FIG. 2 illustrates a cross-sectional view of another example of a printed circuit board 200.

Referring to FIG. 2, the printed circuit board 200 includes a first metal layer 221 and a second metal layer 222 formed on either surface of an insulation layer 211, a via 227, a trench 218, and a heat-transfer structure 225 formed in the trench 218.

The via 227 is a signal via formed for an interlayer electrical connection of circuit patterns, and includes a seed layer, such as an electroless plating layer, and at least one electrolytic plating layer. The seed layer is provided to improve the adhesion of the electrolytic plating layer along the surface of the insulating layer 111.

The heat-transfer structure 225 is disposed within a rod-shaped trench 218 that penetrates through the insulation layer 211. The heat-transfer structure 225 has a greater volume than the via 227.

By forming the heat-transfer structures 225 to have rod shapes, it is possible to dispose several heat-transfer structures 225 with sufficiently large volume to dissipate heat at various locations throughout the printed circuit board 200 while avoiding areas where circuit patterns and vias 227 are concentrated.

In this example, the heat-transfer structures 225 each include a core 220 and an outer layer 223 surrounding the outer surfaces of the core 220.

The outer layer 223 is configured to surround the lateral surfaces and the top surface of the core 220 in the cross-sectional view, without covering the bottom surface of the core 220.

The heat-transfer structure 225 may have a polyhedral shape, such as an elongated cylinder shape or a prism shape with an elongated rectangular base, or a variety of amorphous three-dimensional shapes.

In this example, the core 220 and the outer layer 223 each include at least one plating layer.

The core 220 functions as a plating accelerator of the outer layer 223. By being disposed at a middle portion of the heat-transfer structure 225, the core 220 may prevent the heat-transfer structure 225 from shrinking in its thickness direction at a middle portion thereof.

Thus, the core 220 may prevent the occurrence of dimples on the circuit board surface due to the thermal stress when a heat pad is used.

Further, in this example, lateral surfaces of the core 220 are tilted such that the core 220 have a tapered elongated quadrilateral prism shape. Moreover, in the plan view of the printed circuit board 200, the lateral surface of the core 220 may have one of various shapes such as, for example, an elliptical shape, a rectangular shape, a dumbbell shape, or a zigzag shape. However, the shape of the core 22 is not limited thereto.

A device may first be connected to the heat-transfer structure 225 and then be installed on or embedded in the printed circuit board 200, or may be disposed at a location where the device overlaps at least partially with the heat-transfer structure 225.

As a result, the heat generated within the device may be efficiently dissipated to an outside of the printed circuit board 200 by thermal conduction through the heat-transfer structure 225.

Figure 3:
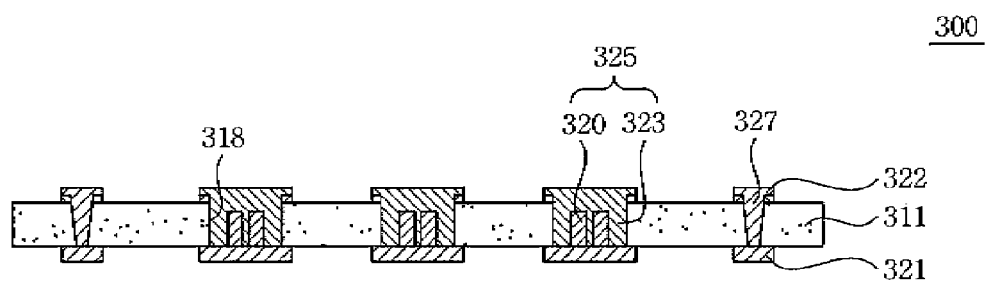
FIG. 3 is a cross-sectional view illustrating another example of a printed circuit board.

FIG. 3 illustrates a cross-sectional view of another example of a printed circuit board 300. For conciseness, any redundant description of the identical or corresponding elements described with respect to FIGS. 1 and 2 will not be repeated.

Referring to FIG. 3, the printed circuit board 300 includes a first metal layer 321 and a second metal layer 322 formed on either surface of an insulation layer 311, a via 327, a trench 318, and a heat-transfer structure 325 formed in the trench 318.

The via 327 is a signal via conventionally used for forming an interlayer electrical connection of circuit patterns, and includes a seed layer, such as an electroless plating layer, and at least one electrolytic plating layer.

The heat-transfer structure 325 is disposed within a trench 318 having a rod shape, and the trench 318 penetrates through the insulation layer 311 so as to have a greater volume than the diameter of the via 327.

By forming the heat-transfer structure 325 to have a rod shape, it is possible to dispose several heat-transfer structures 225 that have sufficiently large volume to dissipate heat at various locations throughout the printed circuit board 300 while readily avoiding areas where circuit patterns and vias 327 are formed in a high concentration.

The heat-transfer structure 325 includes a plurality of cores 320, and an outer layer 323 of the heat-transfer structure 325 surrounds outer surfaces of the plurality of cores 320.

The heat-transfer structure 325 may have a polyhedral shape, such as a cylinder shape with an elongated circular base or a prism shape with an elongated rectangular base, or a variety of amorphous three-dimensional shapes.

In this example, the cores 320 and the outer layer 323 are each constituted with at least one plating layer.

The plurality of cores 320 function as a plating accelerator of the outer layer 323, and may prevent the heat-transfer structure 325 from getting a thickness thereof decreased at a middle portion thereof, by being disposed at the middle portion of the heat-transfer structure 325 where a dimple may readily occur.

The plurality of cores 220 may each have a bar shape or an elongated quadrilateral prism shape. The elongated quadrilateral prism may have a tilted lateral surface as to form a tapered quadrilateral prism shape with a rectangular base.

Figure 4:
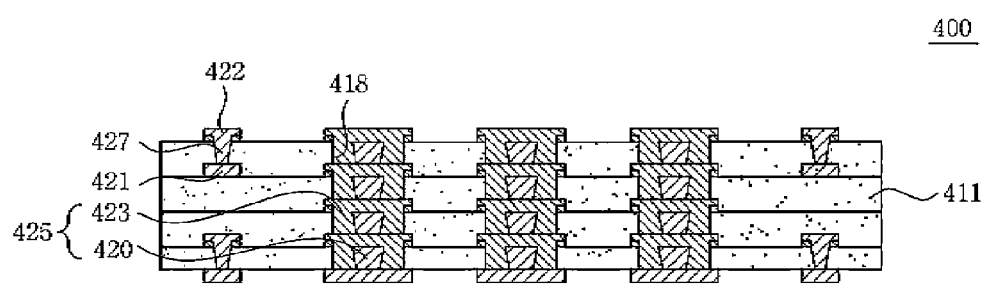
FIG. 4 is a cross-sectional view illustrating another example of a printed circuit board.
Figure 5:
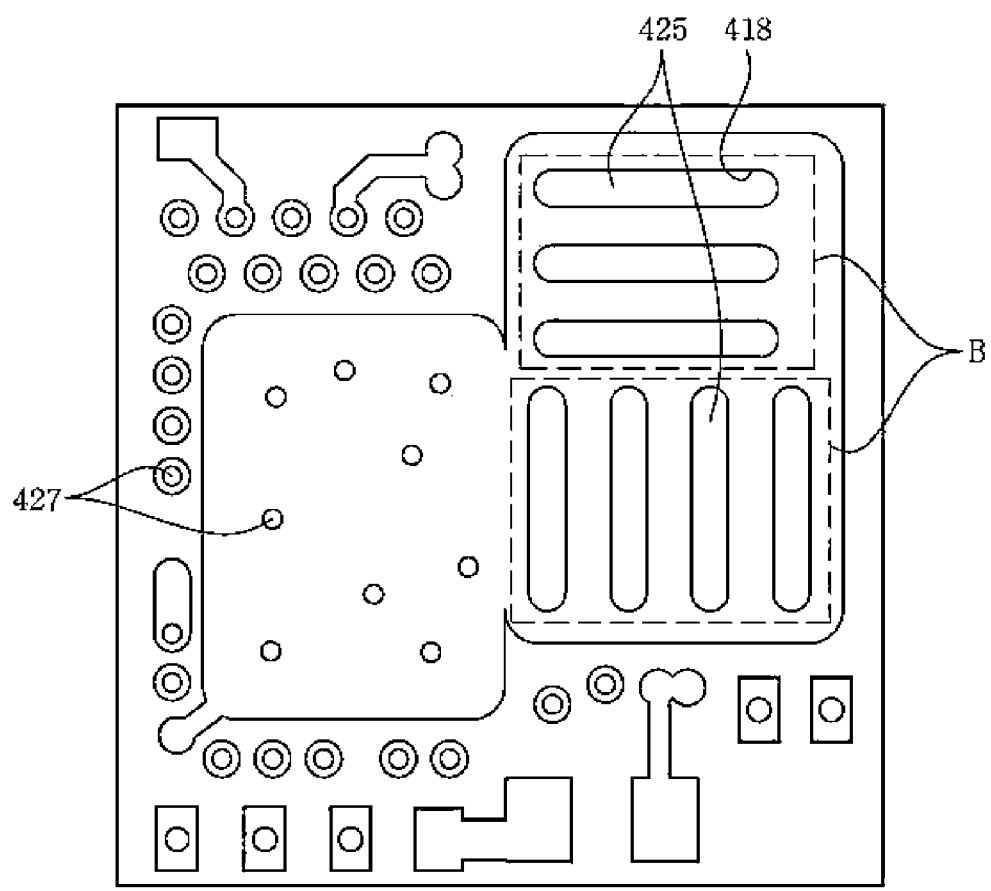
FIG. 5 is a top view illustrating another example of a printed circuit board.

FIG. 4 and FIG. 5 are respectively a cross-sectional view and a top view of another example of a printed circuit board 400. For conciseness, any redundant description of the identical or corresponding elements will not be repeated.

Referring to FIG. 4, the printed circuit board 400 includes a plurality of metal layers 421, 422, which are electrically insulated by a plurality of insulation layers 411 interposed in between the plurality of metal layers 421, 422, respectively, a via 427, a trench 418, and a heat-transfer structure 425 formed in the trench 418.

The via 427 is a signal via formed for an interlayer electrical connection of circuit patterns, and includes a seed layer, such as an electroless plating layer, and at least one electrolytic plating layer.

The heat-transfer structure 425 is each disposed within a rod-shaped trench 418 that penetrates through a corresponding insulation layer 411 so as to have a volume that is greater than the volume of the via 427.

The heat-transfer structures 425 are formed to have a laminated form of being laminated on top of each other, and are connected in a vertical direction of the printed circuit board 400.

In this example, the laminated form of the heat-transfer structure 425 is not limited to what is illustrated hereto and may include a structure of being connected in a zigzag fashion.

Referring to FIG. 5, by having the rod shape, the heat-transfer structure 425 may be formed to have a sufficiently large volume and be readily disposed at various locations of the printed circuit board 400 while avoiding areas where circuit patterns and vias 427 are concentrated.

For example, a device may be mounted in areas marked "B" in FIG. 5. The heat-transfer structures 425 each include a core 420 and an outer layer 423 surrounding outer surfaces of the core 420.

The heat-transfer structures 425 may have a polyhedral shape, such as an elongated cylinder shape or an elongated quadrilateral prism shape with a rectangular base, or a variety of amorphous three-dimensional shapes including a curved surface.

In this example, the core 420 and the outer layer 423 are each constituted with at least one plating layer.

The core 420 functions as a plating accelerator of the outer layer 423, and may further prevent the heat-transfer structure 425 from getting a thickness thereof decreased at a middle portion thereof, by being disposed at the middle portion of the heat-transfer structure 425 where a dimple may readily occur.

Referring to FIG. 4, in this example, the lateral surfaces of the core 420 is tilted so that the core 420 has a tapered quadrilateral prism shape. Moreover, referring to the top view illustrated in FIG. 5, the lateral surface of the core 420 may form one of various shapes such as an elliptical shape, a rectangular shape, a dumbbell shape, or a zigzag shape. However, the shape of the core 420 is not limited thereto; in another example, the core 420 may have a different three dimensional shape.

Referring to FIG. 5, the device may be first connected to the heat-transfer structure 425 and then installed on the printed circuit board 400, or may be disposed at a location where the device overlaps at least partially with the heat-transfer structure 425. As a result, heat generated from the device may be efficiently displaced by the heat-transfer structure 425 to an outside.

The insulation layers 411 may have a solder resist layer formed thereon for exposing a connection pad and as a protective layer of an outermost circuit pattern.

Method of Manufacturing Printed Circuit Board

Figure 6:
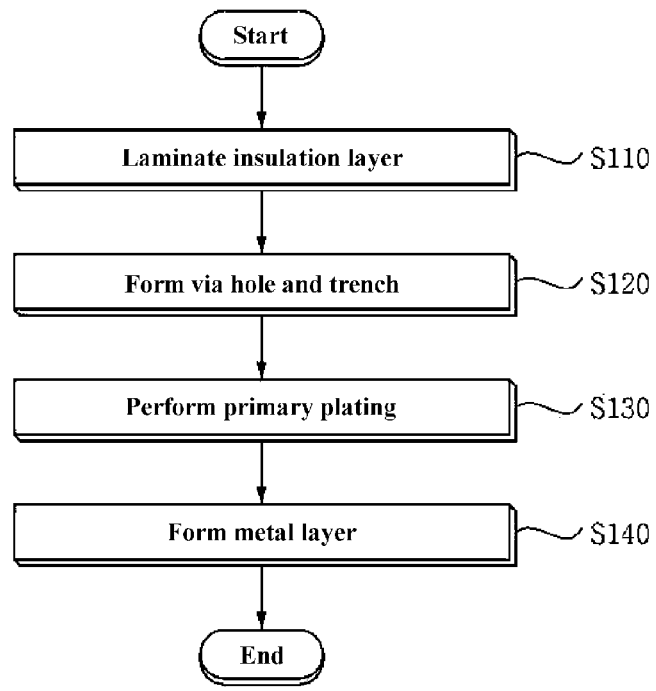
FIG. 6 is a flow diagram illustrating an example of a method of manufacturing a printed circuit board.

FIG. 6 illustrates an example of a method of manufacturing a printed circuit board. FIG. 7 through FIG. 15 illustrate processes of an example of a method of manufacturing a printed circuit board.

Referring to FIG. 6, the method of manufacturing a printed circuit board involves laminating an insulation layer (S110), forming a via hole and a trench in the insulation layer (S120), forming a plating layer in the via hole and the trench through a primary plating (S130), and forming a metal layer on the insulation layer having the plating layer formed thereon (S140).

Hereinafter, processes used in the above method of manufacturing a printed circuit board will be described by referring to cross-sectional views of the printed circuit board shown in FIG. 7 through FIG. 15.

Figure 7:
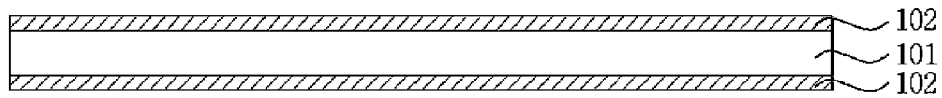
FIG. 7 through FIG. 15 illustrate processes of an example of a method of manufacturing a printed circuit board by illustrating cross-sectional views of the printed circuit board during the manufacturing process.

Referring to FIG. 7, a carrier member 100A is obtained by forming a first metal layer 102 on both surfaces of a core layer 101.

The core layer 101 serves as a support for a thin insulation layer or a metal layer for a circuit when the thin insulation layer or the metal layer for a circuit is formed. The core layer 101 may be made of an insulation material or a metallic material.

The first metal layer 102 may be, for example, a copper foil, but the present disclosure is not limited thereto.

According to one example, a copper clad laminate may be used as the carrier member 100A.

Moreover, the carrier member 100A may be structured only with the core layer and without the first metal layers, or structured to have the first metal layer formed on only one surface of the core layer.

The carrier member may be made of any material used as a support substrate in the field of circuit board, provided that the carrier member is detachable in a later process.

Figure 8:
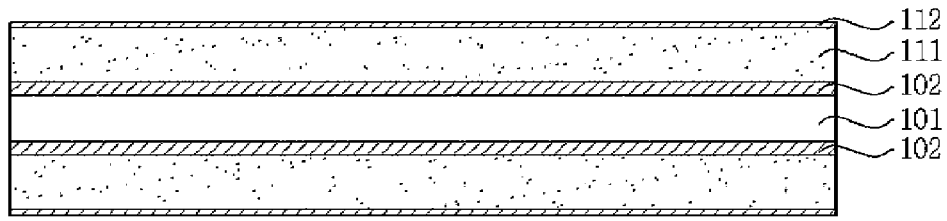

Then, referring to FIG. 8, an insulation layer 111 is laminated on both surfaces of the carrier member 100A.

According to this example, the insulation layer 111 is laminated together with a second metal layer 112 on the both surfaces of the carrier member 100A. However, in another example, the second metal layer 112 may not be present or may be laminated in a separate process.

The second metal layer 112 may be, for example, a copper foil.

Figure 9:
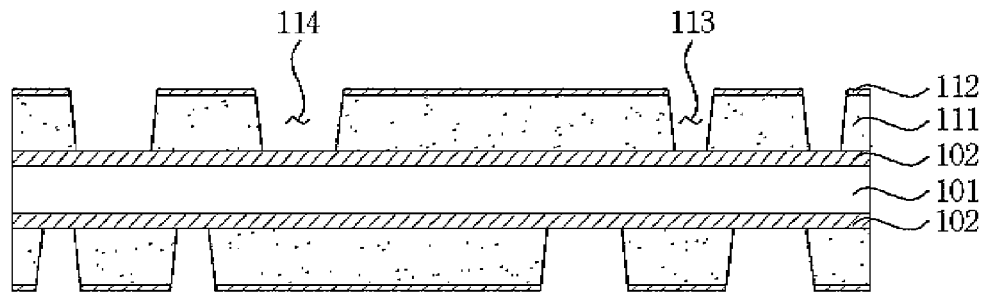

Next, referring to FIG. 9, a via hole 113 and a rod shaped trench 114 are formed by patterning the insulation layer 111 and the second metal layer 112.

The rod shape of the trench 114 includes elongated polyhedron shapes and various other three-dimensional shapes, such as shapes including a planar surfaces or one or more curved surfaces.

The insulation layer 111 and the second metal layer 112 may be patterned using a laser drilling technique or a photolithography technique.

The trench 114 is obtained in order to form a heat-transfer structure. The trench 114 is formed to have a greater volume than the via hole 113. That is, a width or a length of the trench 114 may be greater than a width, a length or a diameter of the via hole 113.

Figure 10:
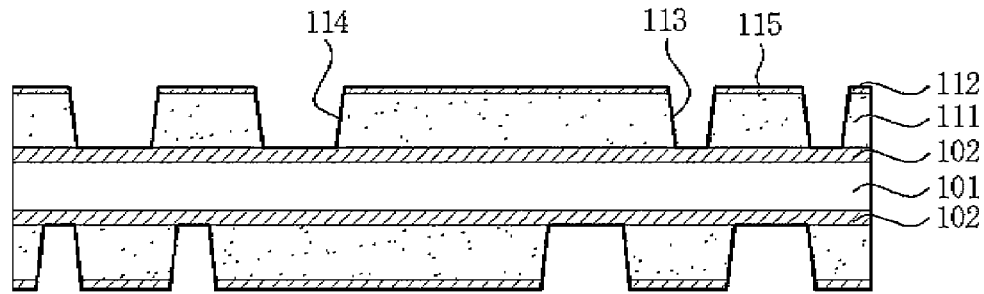

Then, referring to FIG. 10, a seed layer 115 is formed through, for example, electroless plating.

Figure 11:
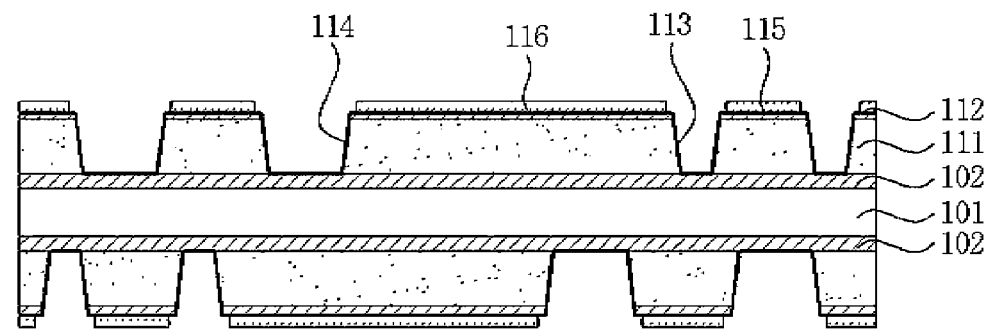

Afterwards, referring to FIG. 11, a plating resist pattern 116 having an opening for a predetermined plating area is formed.

In this example, a dry film may be used for plating resist.

Figure 12:
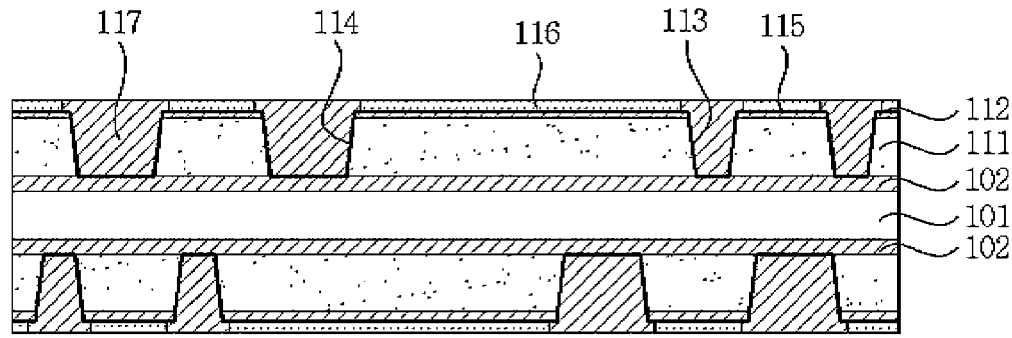

Next, referring to FIG. 12, a plating layer 117 is formed by performing electrolytic plating the predetermined plating area opened by using the plating resist pattern 116. If necessary, the electrolytic plating may be repeated to form a plurality of the plating layers.

Figure 13:
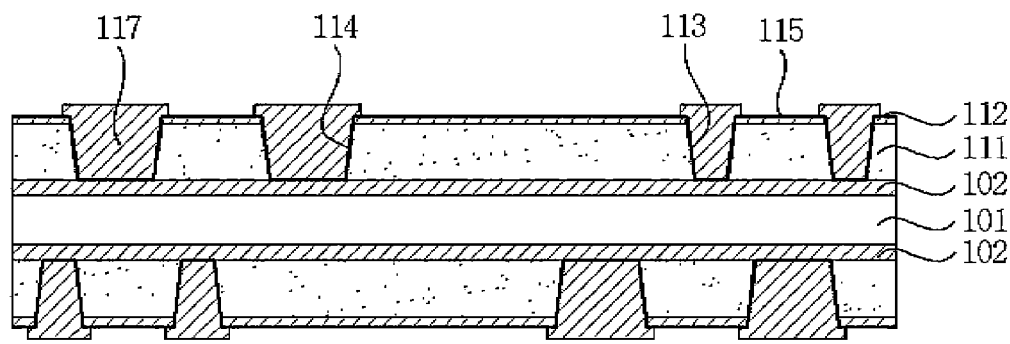

Then, referring to FIG. 13, the plating resist pattern 116 is removed, and a surface smoothing process is carried out, as necessary.

In this example, after forming a metal layer by utilizing a circuit forming process such as flash etching, the processes shown in FIG. 8 through FIG. 13 may be repeated a number of times as necessary to form a multilayered printed circuit board laminate having a laminated heat-transfer structure.

Figure 14:
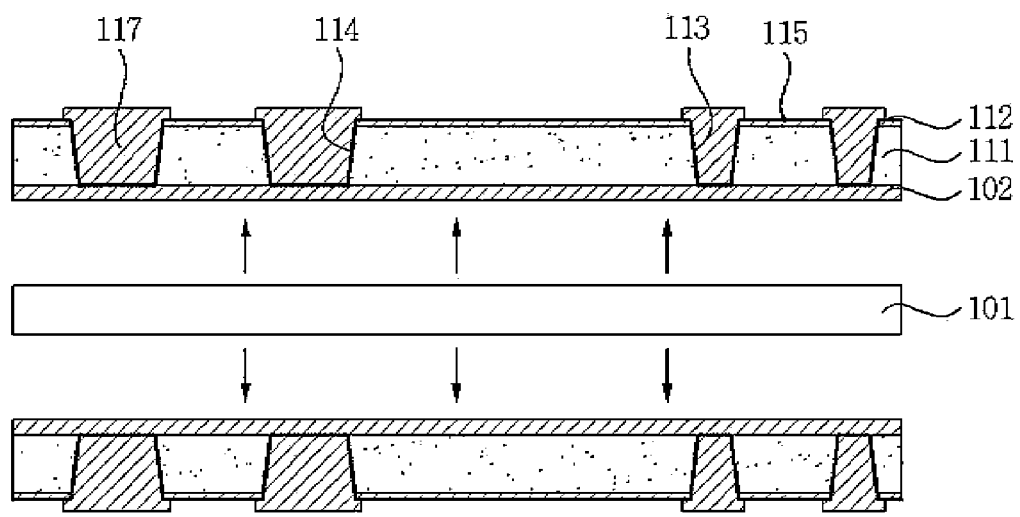

Next, referring to FIG. 14, a pair of laminates are separated from the core layer 101 of the carrier member.

The separation process may be carried out using a variety of methods depending on the structure of the carrier member.

For example, the separation process may be performed by using a releasing agent, by separating a detachable copper foil, or the like; however, the present disclosure is not limited thereto.

Figure 15:
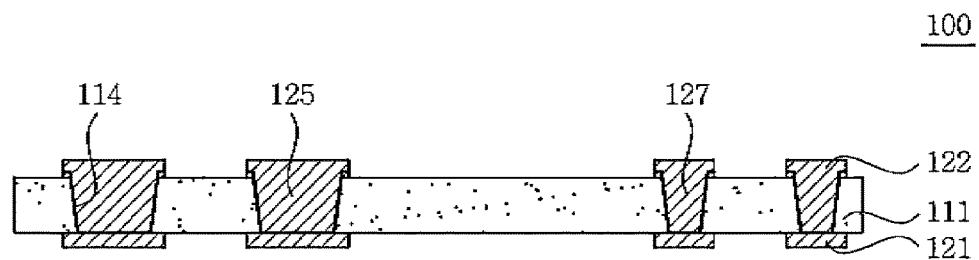

Thereafter, referring to FIG. 15, a circuit forming process, such as patterning or flash etching process, is applied to both surfaces of the separated laminate to form a printed circuit board 100 in which a first metal layer 121 and a second metal layer 122 are formed on either surface of the insulation layer 111.

The first metal layer 121 and the second metal layer 122 are electrically connected to each other through a via 127 and/or a heat-transfer structure 125.

Although it is illustrated and described in the present example that the metal layer is formed as a stopper layer on both surfaces of the heat-transfer structure 125, the metal layer may be omitted from one surface or both surfaces of the heat-transfer structure 125, if necessary.

The heat-transfer structure 125 is formed to have a greater volume than that of the via 127.

The heat-transfer structure 125 may have a polyhedral shape, such as a quadrilateral prism shape with an elongated rectangular base, or a variety of amorphous three-dimensional shapes.

According to the illustrated example, by forming the heat-transfer structure 125 in the rod shape, the heat-transfer structure 125 having a large volume may be readily disposed at various locations of the printed circuit board 100 while avoiding areas where circuit patterns and vias 127 are provided in a high concentration.

Further, by performing a number of plating processes while applying a manufacturing method of a thin board or a coreless substrate using a carrier member as a method for manufacturing a high-integrated thin board, a common via and the heat-transfer structure may be formed simultaneously.

Figure 16:
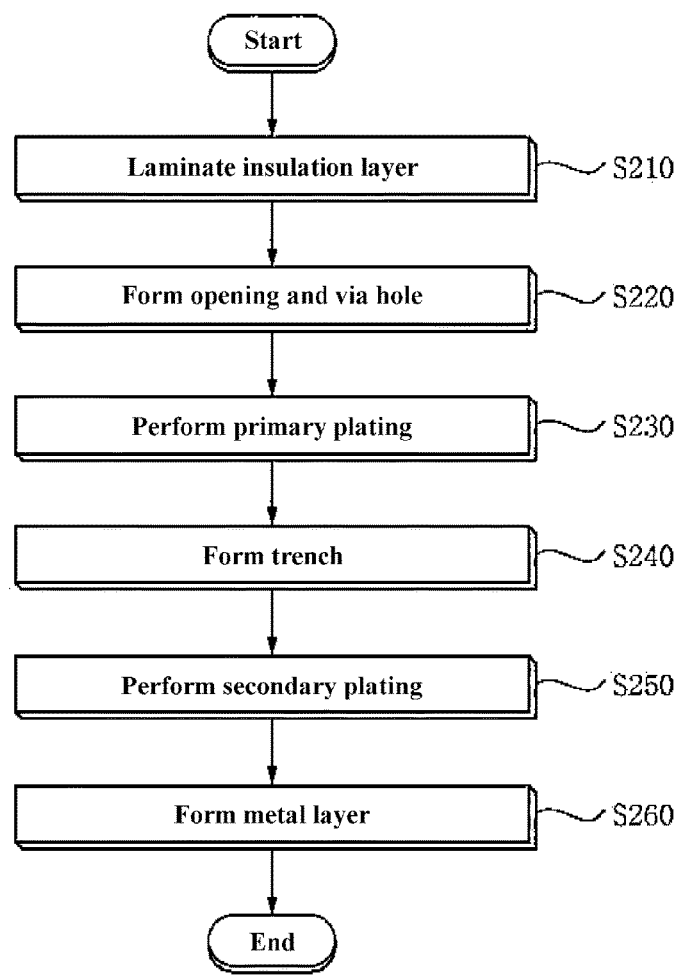
FIG. 16 is a flow diagram illustrating another example of a method of manufacturing a printed circuit board.

FIG. 16 is a flow diagram illustrating another example of a method of manufacturing a printed circuit board, and FIG. 17 through FIG. 30 illustrate processes used in another example of a method of manufacturing a printed circuit board by illustrating cross-sectional view of the printed circuit board during the manufacturing process.

Referring to FIG. 16, the method of manufacturing a printed circuit board involves laminating an insulation layer (S210), forming an opening and a via hole in the insulation layer (S220), filling a first plating layer in the opening and the via hole through primary plating (S230), forming a trench in the insulation layer such that an outer surface of the first plating layer filled in the opening is exposed (S240), filling a second plating layer in the trench through secondary plating (S250), and forming a metal layer on the insulation layer (S260).

Hereinafter, processes used in the above method of manufacturing a printed circuit board will be described by referring to cross-sectional views of the printed circuit board shown in FIG. 17 through FIG. 30.

Figure 17:
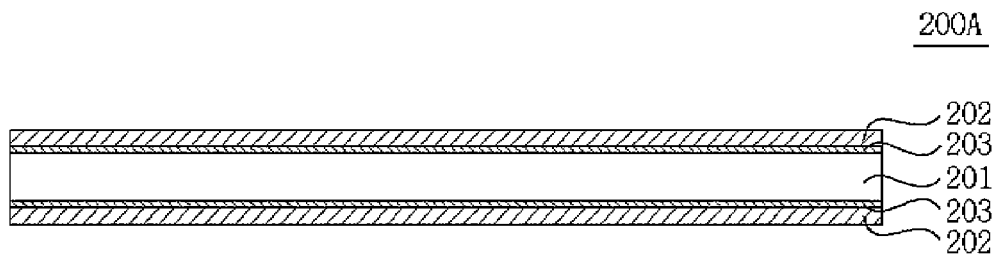
FIG. 17 through FIG. 30 illustrate processes of another example of a method of manufacturing a printed circuit board by illustrating cross-sectional view of the printed circuit board during the manufacturing process.

Firstly, referring to FIG. 17, a carrier member 200A, having a first metal layer 202 formed on both surfaces of a core layer 201, is obtained.

The core layer 201 may be made of a resin or a metal. The metal layer 202 may be, for example, a copper foil, but the present disclosure is not limited thereto.

Moreover, a separation layer 203 may be interposed between the core layer 201 and the first metal layer 202. The separation layer 203 may be, for example, a releasing film or a detachable copper foil.

Figure 18:
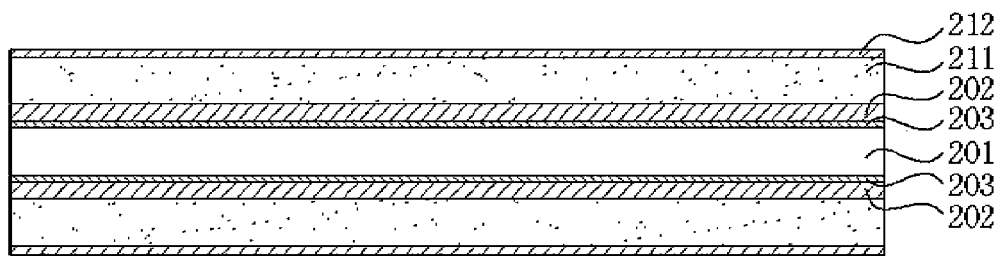

Then, referring to FIG. 18, an insulation layer 211 is laminated on both surfaces of the carrier member 200A.

In this example, the insulation layer 211 is laminated together with a second metal layer 212 on the both surfaces of the carrier member 200A.

The second metal layer 212 may be, for example, a copper foil.

Figure 19:
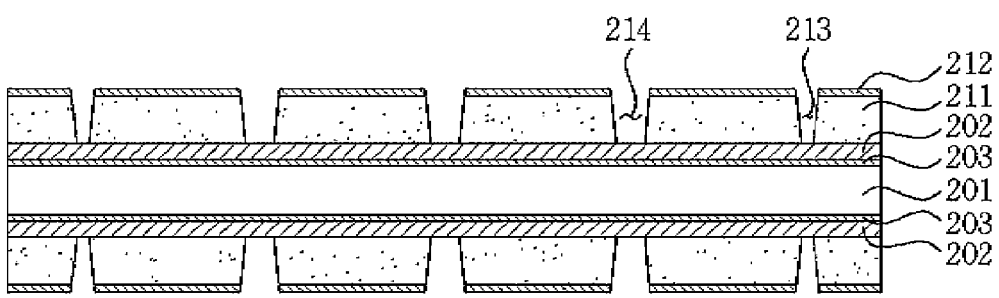

Next, referring to FIG. 19, a via hole 213 and a rod shaped opening 214 are formed by patterning the insulation layer 211 and the second metal layer 212.

The rod-shaped opening 214 may have an elongated polyhedron shape with planar surfaces provided along its length direction, or other three-dimensional shapes including curved surfaces. For instance, the rod shape may refer to a tapered quadrilateral prism shape or an elongated prism shape with rounded edges.

The insulation layer 211 and the second metal layer 212 may be patterned using a common laser drill or photolithography.

The opening 214 is formed to have a greater volume than the via hole 213.

Figure 20:
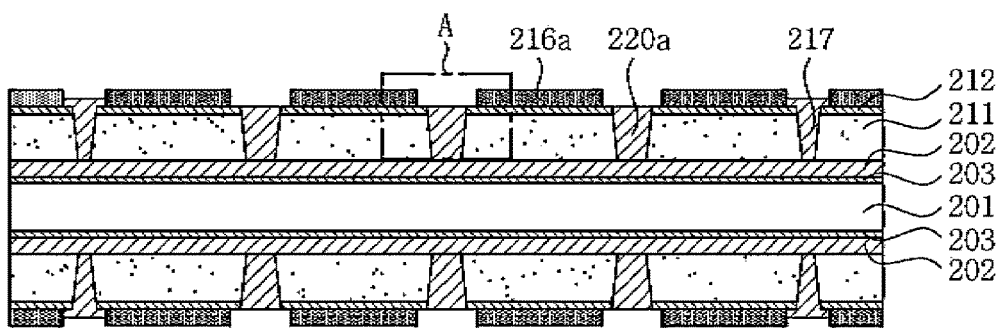

Then, referring to FIG. 20, after forming a seed layer (not shown) through electroless plating, a first plating resist pattern 216a, which includes one or more openings at predetermined plating areas, is formed. A first plating layer is formed by plating the predetermined plating area by using the first plating resist pattern 216a, and the first plating layer includes both a plating layer for core 220a and a plating layer for via-metal layer 217.

The first plating layer may include an electroless plating layer and/or an electrolytic plating layer.

In this example, a dry film may be used as a plating resist pattern.

Figure 21:
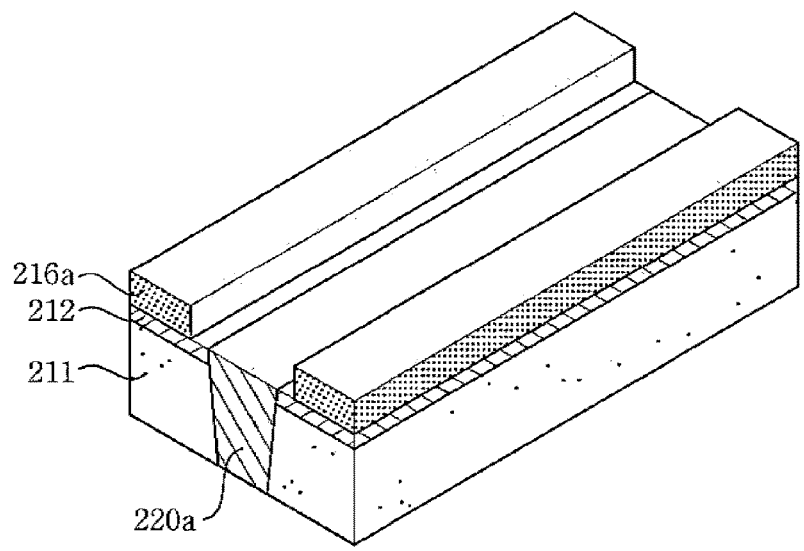

FIG. 21 is a magnified perspective view illustrating the portion marked "A" in FIG. 20, which is an area in which the plating layer for core 220a is formed.

Figure 22:
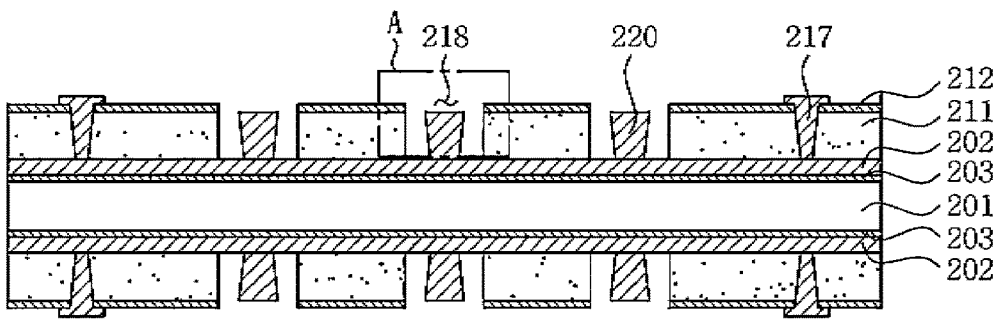

Afterwards, referring to FIG. 22, after the first plating resist pattern 216a is removed, the first metal layer 212 and the insulation layer 211 are removed by laser drilling at an area where a heat-transfer structure is to be formed. Then, a trench 218, which exposes an outer surface of a core 220, is formed.

The trench 218 has an elongated rod shape. In this example, the rod shape has a quadrilateral prism shape; however, in another example, the trench may have another polyhedron shape or various three-dimensional shapes that includes one or more curved surfaces.

Referring to FIG. 22, it is possible to perform the laser drilling after forming an etching resist pattern that has an opening for an area for forming the heat-transfer structure.

In this example, the core 220 may be formed by removing an area of the insulation layer 211 where the heat-transfer structure is to be formed or by additionally processing the plating layer for core 220a together with the area of the insulation layer 211 where the heat-transfer structure is to be formed, during the laser drilling.

By using diffused reflection occurred by the plating layer 220a for core during the laser drilling, it is possible to process a large area with a small amount of energy, thereby saving processing energy.

The core 220, which subsequently serves as a plating accelerator of an outer layer, may prevent the heat-transfer structure from shrinking along a thickness direction thereof by being disposed at the middle portion of the heat-transfer structure where a dimple may readily occur.

A lateral surface of the core 220 may have a tapered shape. In other words, the sidewalls of the core 220 may be slanted from a vertical direction such that its cross-sectional area is broader at the bottom or at the top. Moreover, the lateral surface of the core 220 may have one of various shapes such as, for example, an elliptical shape, a rectangular shape, a dumbbell shape, or a zigzag shape.

Figure 23:
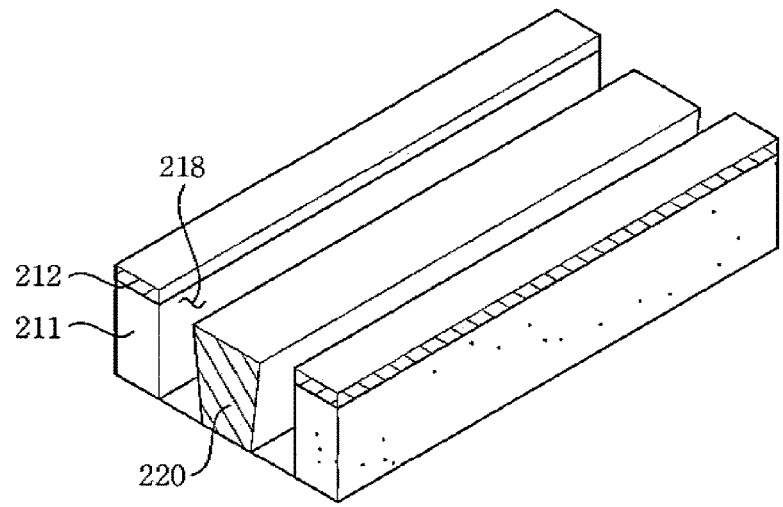

FIG. 23 is a magnified perspective view illustrating the portion marked "A" in FIG. 22, that is, an area in which the core 220 in the shape of a rod is formed.

Figure 24:
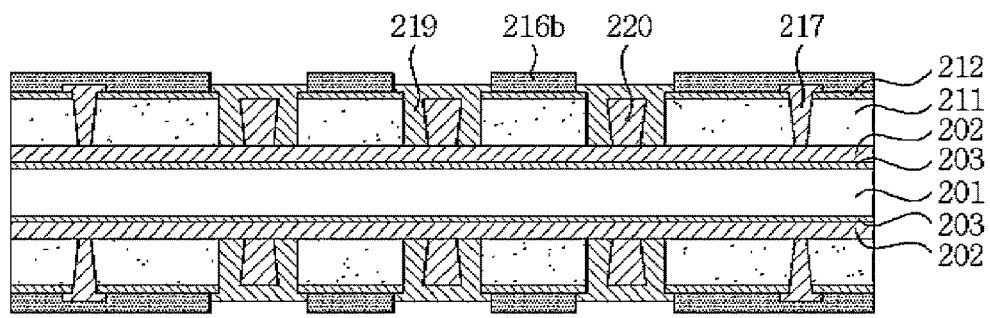

Next, referring to FIG. 24, after forming a seed layer (not shown) through electroless plating, a second plating resist pattern 216b, having an opening for a predetermined plating area, is formed, and a second plating layer for outer-metal layer 219 is formed by plating through the opening for the predetermined plating area by using the second plating resist pattern 216b. The second plating area for outer-metal layer 219 may include an electroless plating layer and an electrolytic plating layer, and may be configured with a plurality of plating layers by repeating the plating process three or more times.

Figure 25:
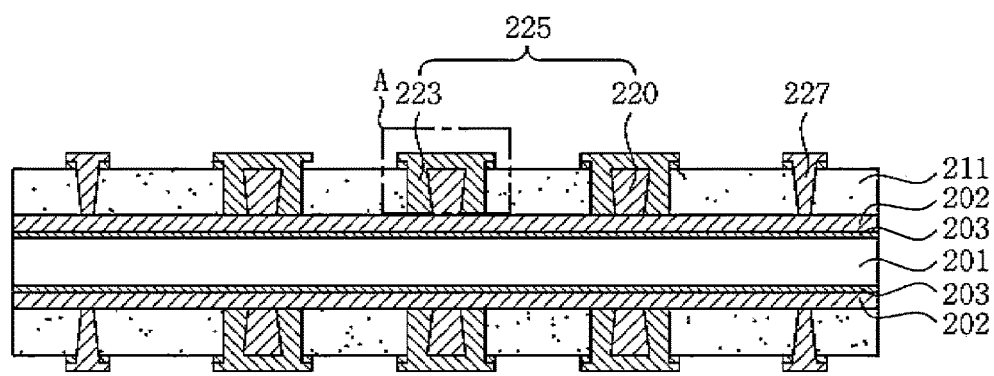

Thereafter, referring to FIG. 25, the second plating resist pattern 216b is removed, and a via 227, a heat-transfer structure 225 and a metal layer are formed through a common circuit forming process, such as flash etching.

Figure 26:
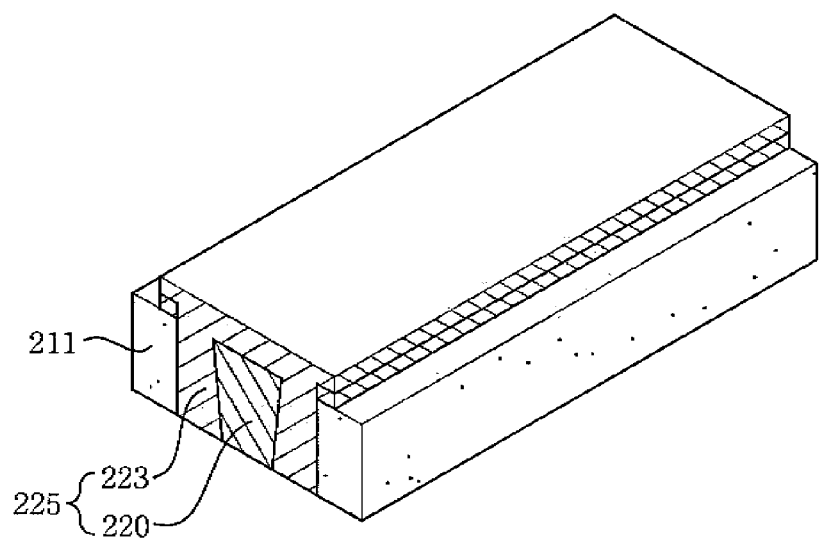

FIG. 26 is a magnified perspective view illustrating the portion marked "A" in FIG. 25, that is, an area in which the heat-transfer structure 225 is formed.

Referring to FIG. 25 and FIG. 26, the heat-transfer structure 225 is constituted with the core 220 and an outer layer 223 surrounding outer surfaces of the core 220.

Figure 27:
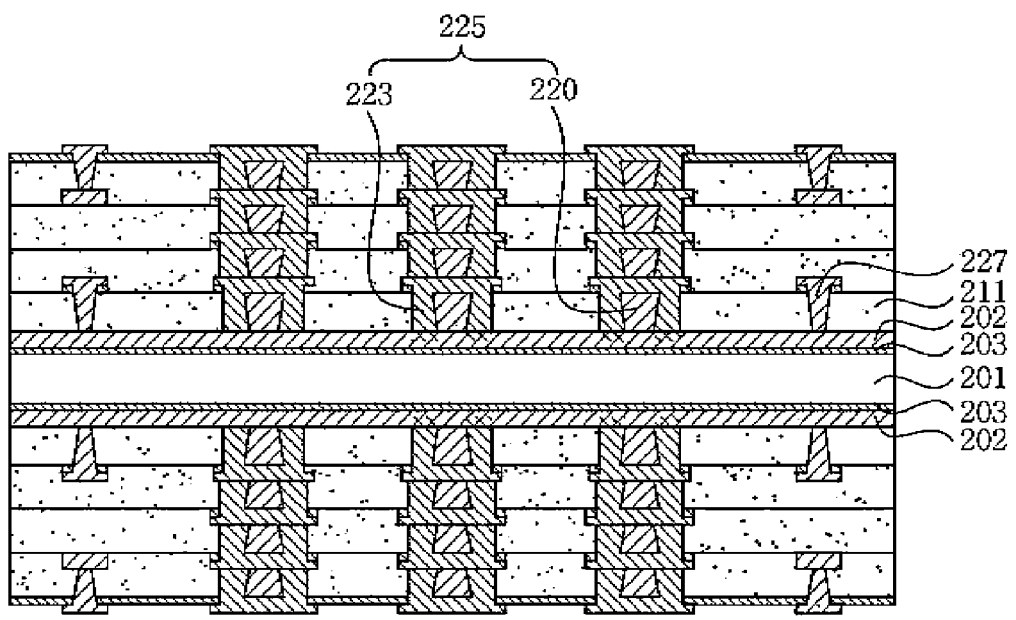

Then, referring to FIG. 27, the processes shown in FIG. 16 through FIG. 26 are repeated a number of times to form a multilayered printed circuit board laminate having the heat-transfer structure 225 laminated in every layer.

Figure 28:
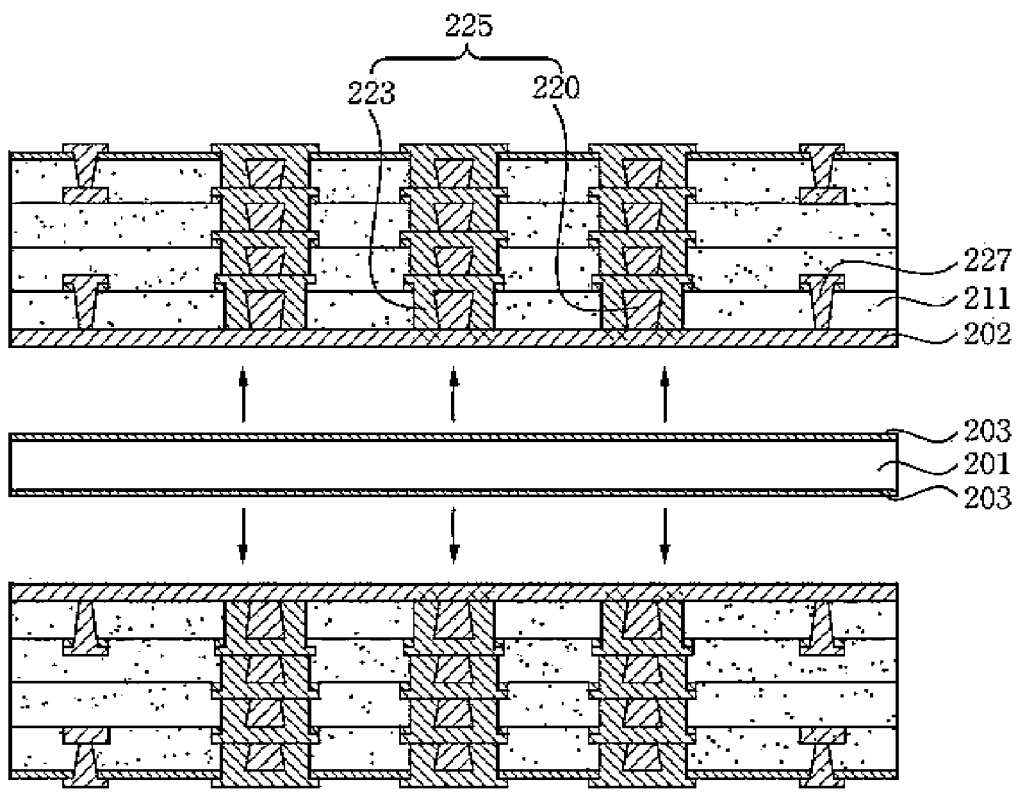

Next, referring to FIG. 28, a pair of laminates are separated from the core layer 201 of the carrier member 200A.

The separation process may be carried out using a variety of methods depending on the structure of the carrier member 200A and the material of the separation layer 203.

For example, the separation process may be performed using a releasing agent, using a detachable copper foil, or the like, but the present disclosure is not limited thereto.

Figure 29:
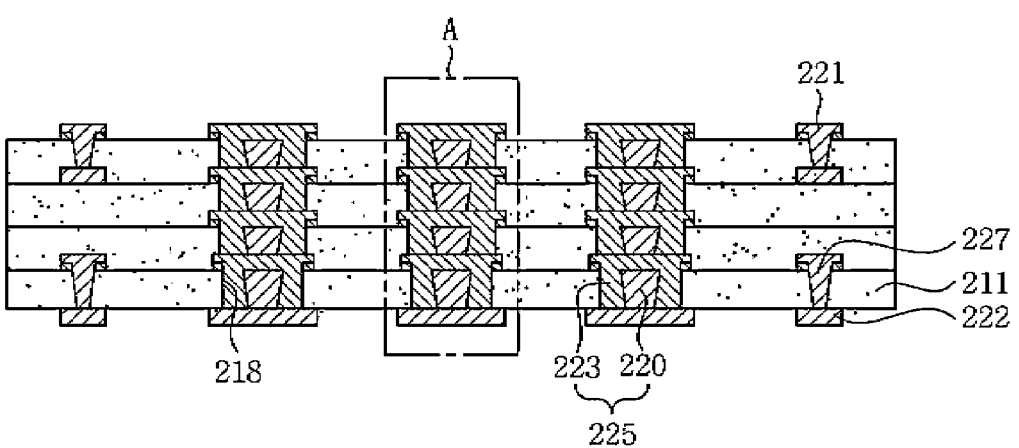

Thereafter, referring to FIG. 29, a common circuit forming process, such as patterning or flash etching, is applied to both surfaces of the separated laminate to form a printed circuit board in which a first metal layer 221 and a second metal layer 222 are formed on either surface of the insulation layer 211.

The first metal layer 221 and the second metal layer 222 are connected with each other through the via 227 and/or the heat-transfer structure 225.

Figure 30:
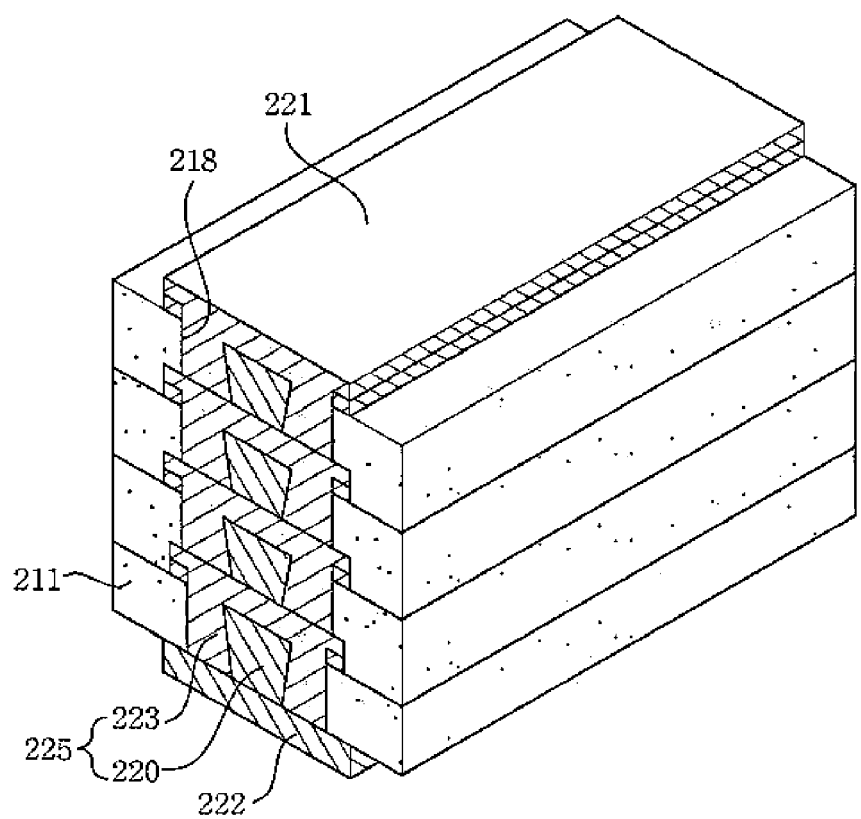

FIG. 30 is a magnified perspective view illustrating the portion marked "A" in FIG. 25, that is, an area in which a plurality of heat-transfer structures 225 are formed.

Referring to FIG. 29 and FIG. 30, the heat-transfer structures 225 each include a core 220 and an outer layer 223 surrounding outer surfaces of the core 220.

Moreover, the heat-transfer structures 225 are stacked so as to be laminated on top of each other.

In this example, although it is illustrated that the heat-transfer structure 225 has a rectangular prism shape with a rectangular base, the present disclosure is not limited thereto. In other example, the heat-transfer structure 225 may be formed in any one of a variety of amorphous three-dimensional shapes, such as a pyramidal shape with a rectangular base.

The heat-transfer structure 225 has a bigger volume than the via 227 formed for interlayer electrical connection of circuit patterns.

According to the present example, by forming the heat-transfer structure 225 in the rod shape, the heat-transfer structure 225 having a large volume may be readily formed at various locations of the printed circuit board 200 while avoiding areas where concentrated circuit patterns and vias 227 are disposed.

Moreover, by forming the heat-transfer structure having a big volume while applying a manufacturing method of a thin board or a coreless substrate using a carrier member as a method for manufacturing a high-integrated thin board, it is possible to increase an aspect ratio of an opening which is to be filled with a plating for outer layer, thereby accelerating the plating when plating layers for outer layer and metal layer are formed and reducing a defect caused by a dimple.

Moreover, since smoothness may be obtained without a common smoothing process such as etching or polishing, it is possible to simplify the manufacturing processes and save the processing costs.

Figure 31:
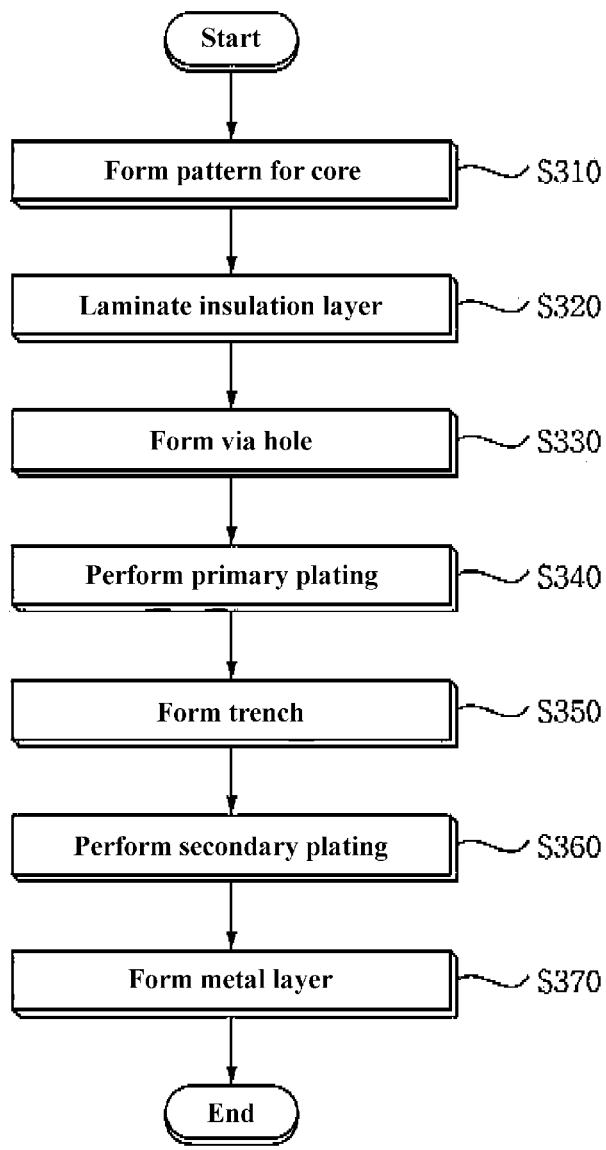
FIG. 31 is a flow diagram illustrating another example of a method of manufacturing a printed circuit board.

FIG. 31 is a flow diagram illustrating another example of a method of manufacturing a printed circuit board, and FIG. 32 through FIG. 41 illustrate processes used in another example of a method of manufacturing a printed circuit board by illustrating cross-sectional view of the printed circuit board during a manufacturing process.

Referring to FIG. 31, the method of manufacturing a printed circuit board involves forming a pattern for a core (S310), laminating an insulation layer so as to allow the pattern for a core to be embedded (S320), forming a via hole in the insulation layer (S330), filling a first plating layer in the via hole through primary plating (S340), forming a rod-shaped trench in the insulation layer such that an outer surface of the pattern for a core is exposed (S350), filling a second plating layer in the trench through secondary plating (S360), and forming a metal layer on the insulation layer (S370).

Hereinafter, processes used in the above method of manufacturing a printed circuit board will be described by referring to cross-sectional views of the printed circuit board shown in FIG. 32 through FIG. 41.

Figure 32:
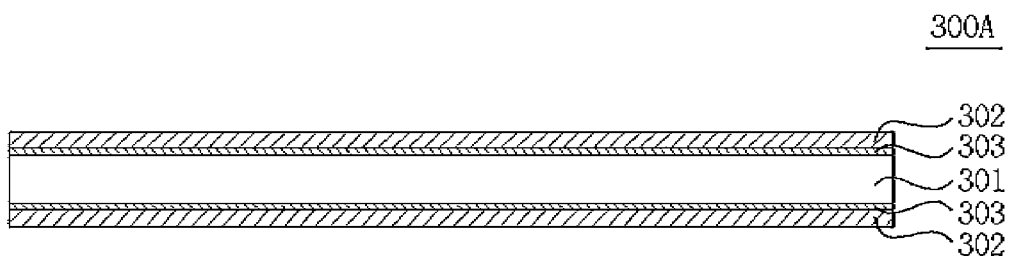
FIG. 32 through FIG. 41 illustrate processes of another example of a method of manufacturing a printed circuit board by illustrating cross-sectional view of the printed circuit board during the manufacturing process.

Firstly, referring to FIG. 32, a carrier member 300A, having a first metal layer 302 formed on both surfaces of a core layer 301, is obtained.

The core layer 301 may be made of a resin or a metal, and the first metal layer 302 may be, for example, a copper foil, but the present disclosure is not limited thereto.

Moreover, a separation layer 303, for example, a releasing film or a detachable copper foil, may be interposed between the core layer 301 and the first metal layer 302.

Figure 33:
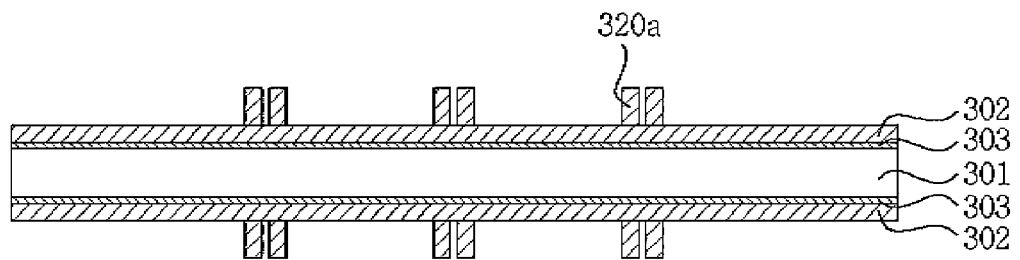

Then, referring to FIG. 33, a plurality of patterns for a core 320a, each of which has a rod shape, are formed on both surfaces of the carrier member 300A.

The plurality of patterns for a core 320a may be formed using a photolithography method, but the present disclosure is not limited thereto.

The plurality of patterns for a core 302a functions to accelerate a plating later when a plating layer for outer layer of a heat-transfer structure is formed.

Figure 34:
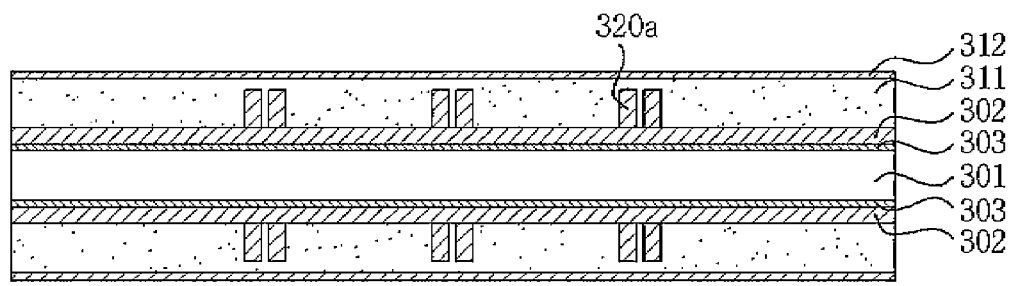

Next, referring to FIG. 34, an insulation layer 311 is laminated on both surfaces of the carrier member 300A having the plurality of patterns for a core 320a formed thereon.

Selectively, the insulation layer 311 may be laminated together with a second metal layer 312 on the both surfaces of the carrier member 300A.

The second metal layer 312 may be, for example, a copper foil.

In this example, the insulation layer 311 may be formed to be twice as thick as a thickness of the pattern for a core 320a.

Figure 35:
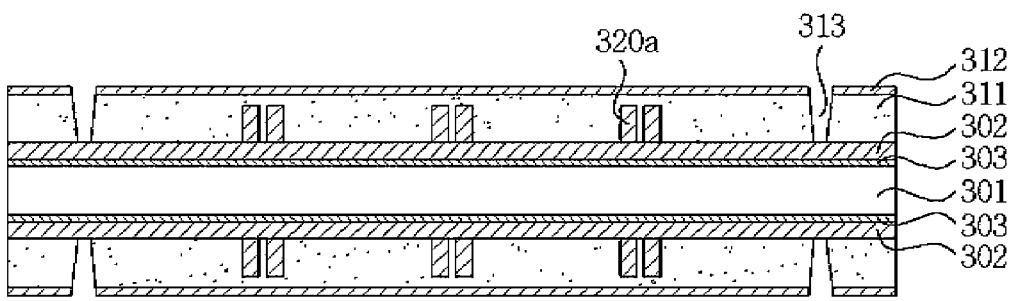

Next, referring to FIG. 35, a via hole 313 is formed by patterning the insulation layer 311 and the second metal layer 312.

The insulation layer 311 and the second metal layer 312 may be patterned using a common laser drill or photolithography.

Figure 36:
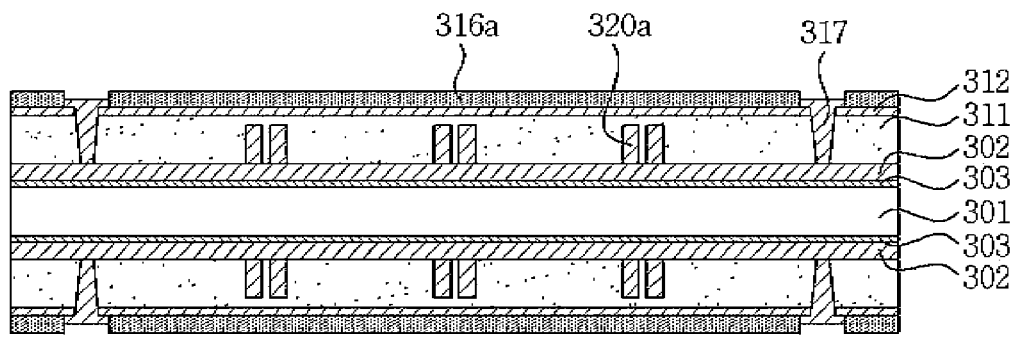

Then, referring to FIG. 36, after forming a seed layer (not shown) through electroless plating, a first plating resist pattern 316a, having an opening for a predetermined plating area is formed, and a first plating layer for via-metal layer 317 is formed by plating the predetermined plating area by using the first plating resist pattern 316a.

The first plating layer may include an electroless plating layer and an electrolytic plating layer.

Figure 37:
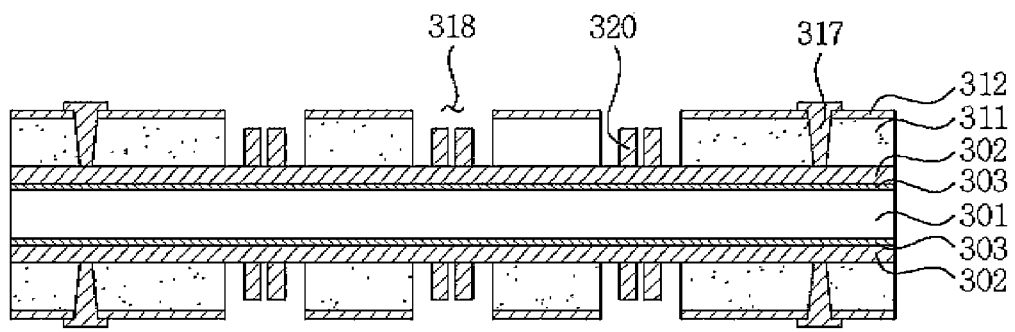

Afterwards, referring to FIG. 37, after the first plating resist pattern 316a is removed, the first metal layer 312 and the insulation layer 311 are removed through laser drilling at an area where a heat-transfer structure is to be formed, and then a trench 318, which exposes a plurality of cores 320, is formed.

The rod-shaped trench 318 may have a polyhedron shape such as a rectangular prism shape or various other three-dimensional shapes. The rod-shaped trench 318 may have a shape that includes curved surfaces.

In this example, it is possible to perform the laser drilling after forming an etching resist pattern that has an opening for a laser drilling area for forming the heat-transfer structure therein.

The trench 318 is formed to have a greater volume than the via hole 313.

In this example, the plurality of cores 320 may be formed by additionally processing the plurality of patterns for core 320a together at the time of removing an area of the insulation layer 311 where the heat-transfer structure is to be formed and, while the laser drilling is carried out.

By using diffused reflection occurred by the plurality of patterns for core 320a during the laser drilling, it is possible to process a large area with a small amount of energy, thereby saving processing energy.

The plurality of cores 320, which function later as a plating accelerator of an outer layer, may prevent the heat-transfer structure from getting a thickness thereof decreased at a middle portion thereof, by being disposed at the middle portion of the heat-transfer structure where a dimple may be readily occurred.

The plurality of cores 320 may each have, for example, a rod shape that corresponds to a rectangular prism having a rectangular base.

Figure 38:
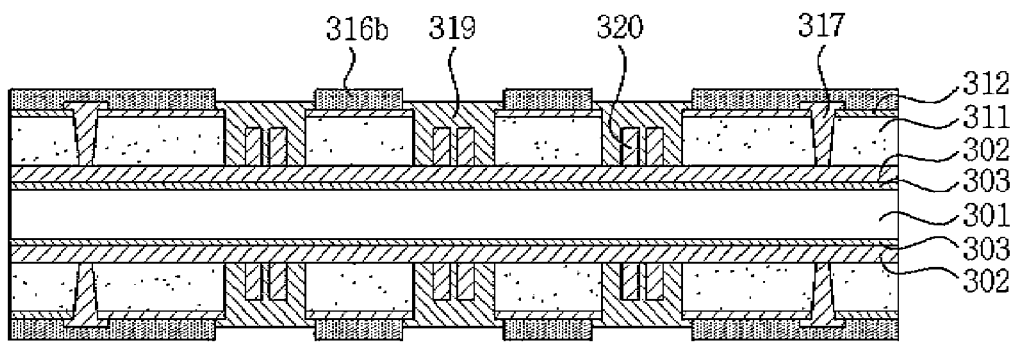

Next, referring to FIG. 38, after forming a seed layer (not shown) through electroless plating, a second plating resist pattern 316b, having an opening for a predetermined plating area is formed, and a second plating layer for outer-metal layer 319 is formed by plating the predetermined plating area by using the second plating resist pattern 316b. The second plating area for outer-metal layer 319 of the heat-transfer structure may include an electroless plating layer and an electrolytic plating layer, and may be configured with a plurality of plating layers by repeating the plating process three or more times.

Figure 39:
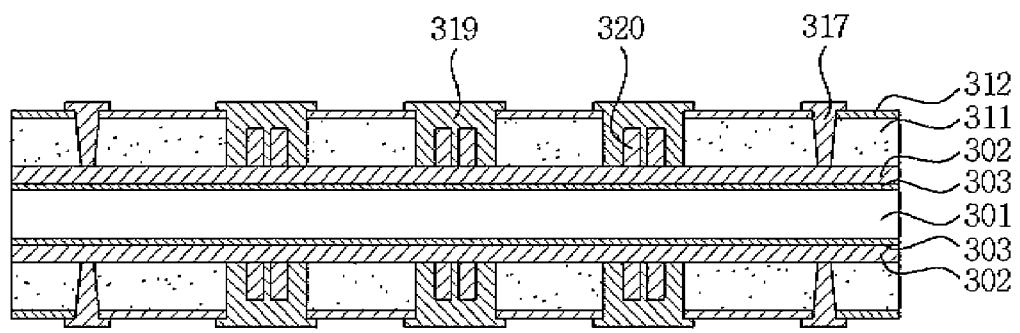

Afterward, referring to FIG. 39, the second plating resist pattern 316b is removed.

In this example, as necessary, after forming a metal layer by utilizing a common circuit forming process, such as flash etching, the processes shown in FIG. 33 through FIG. 39 may be repeated a number of times to form a multilayered printed circuit board laminate having a laminated heat-transfer structure laminated in every layer.

Figure 40:
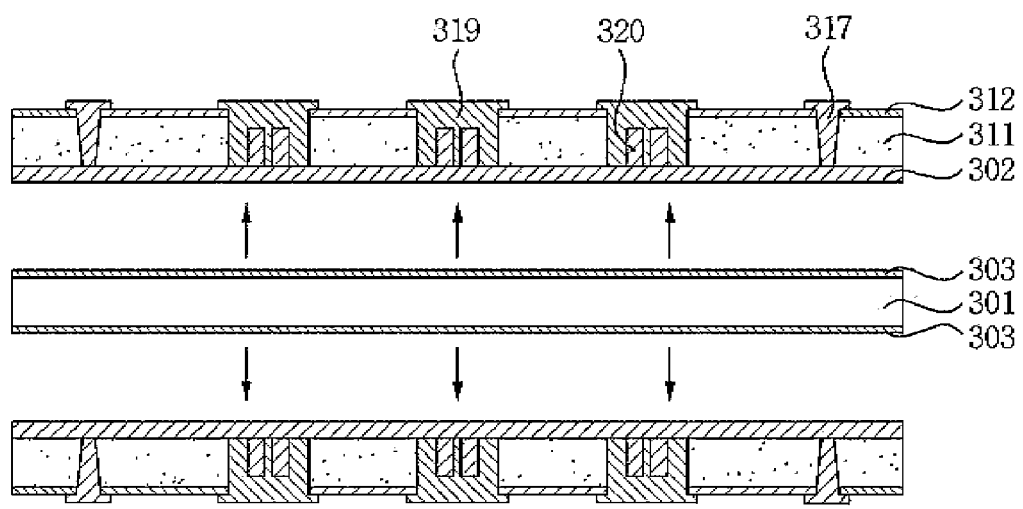

Next, referring to FIG. 40, a pair of laminates are separated from the core layer of the carrier member.

The separation process may be carried out using a variety of methods depending on the structure of the carrier member 300A and the material of the separation layer 303.

For example, the separation process may be performed using a releasing agent, using a detachable copper foil, or the like, but the present disclosure is not limited thereto.

Figure 41:
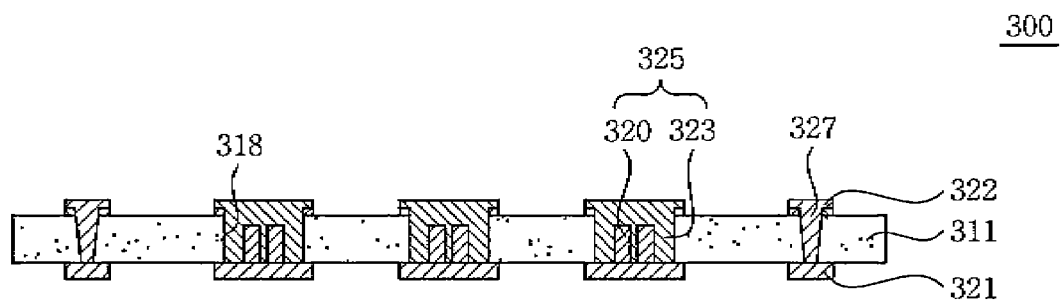

Thereafter, referring to FIG. 41, a common circuit forming process, such as patterning or flash etching, is applied to both surfaces of the separated laminate to form a printed circuit board 300 in which a first metal layer 321 and a second metal layer 322 are formed on either surface of the insulation layer 311.

The first metal layer 321 and the second metal layer 322 are connected with each other through a via 327 and/or a heat-transfer structure 325.

The heat-transfer structure 325 is constituted with the plurality of cores 320 and an outer layer 323 surrounding outer surfaces of the plurality of cores 320.

The heat-transfer structure 325 may have a polyhedral shape, such as a column or prism shape with a rectangular base, or a variety of amorphous three-dimensional shapes.

The heat-transfer structure 325 has a bigger volume than the via 327 formed for interlayer electrical connection of circuit patterns.

According to the present example, by forming the heat-transfer structure having a big volume while applying a manufacturing method of a thin board or a coreless substrate using a carrier member as a method for manufacturing a high-integrated thin board, it is possible to increase an aspect ratio of an opening which is to be filled with a plating for outer layer, thereby accelerating the plating when plating layers for outer layer and metal layer are formed and reducing a defect caused by a dimple.

Moreover, since smoothness may be obtained without a common smoothing process such as etching or polishing, it is possible to simplify the manufacturing processes and save the processing costs.

Although a method of manufacturing a coreless substrate using a carrier member has been described above, the present disclosure is not limited thereto, and it shall be appreciated by those who are skilled in the art that a common coreless substrate may be used.

Electronic Module

Figure 42:
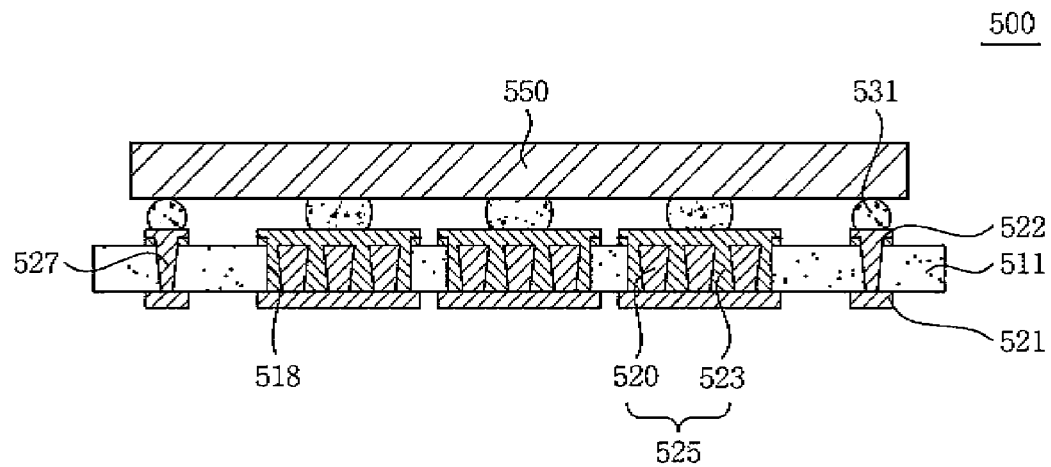
FIG. 42 is a cross-sectional view illustrating an example of an electronic module.

FIG. 42 is a cross-sectional view illustrating an example of an electronic module 500, and any redundant description of the identical or corresponding elements will not be repeated.

Referring to FIG. 42, the electronic module 500 includes a first meal layer 521 and a second metal layer 522 formed on either surface of an insulation layer 511, a via 527, a trench 518, a heat-transfer structure 525 formed in the trench 518, and a device 550 mounted on a solder bump 531 interposed between the device 550 and the via 527 and the heat-transfer structure 525

The via 527 is a signal via commonly formed for an interlayer electrical connection of circuit patterns.

The heat-transfer structure 525 is formed to have a greater volume than that of the via 527.

The heat-transfer structure 525 is constituted with a plurality of cores 520 and an outer layer 523 surrounding outer surfaces of the cores 520.

The device 550 may be a heat-dissipating device, such as a common integrated circuit (IC) chip, or may not be limited to any electronic component as long as it can be installed or embedded in a printed circuit board.

The insulation layers 511 may have a solder resist layer formed thereon for exposing a connection pad and as a protective layer of an outermost circuit pattern.

According to the present example, heat generated from the device 550 is efficiently discharged from the electronic module 500 through the heat-transfer structure 525.

Figure 43:
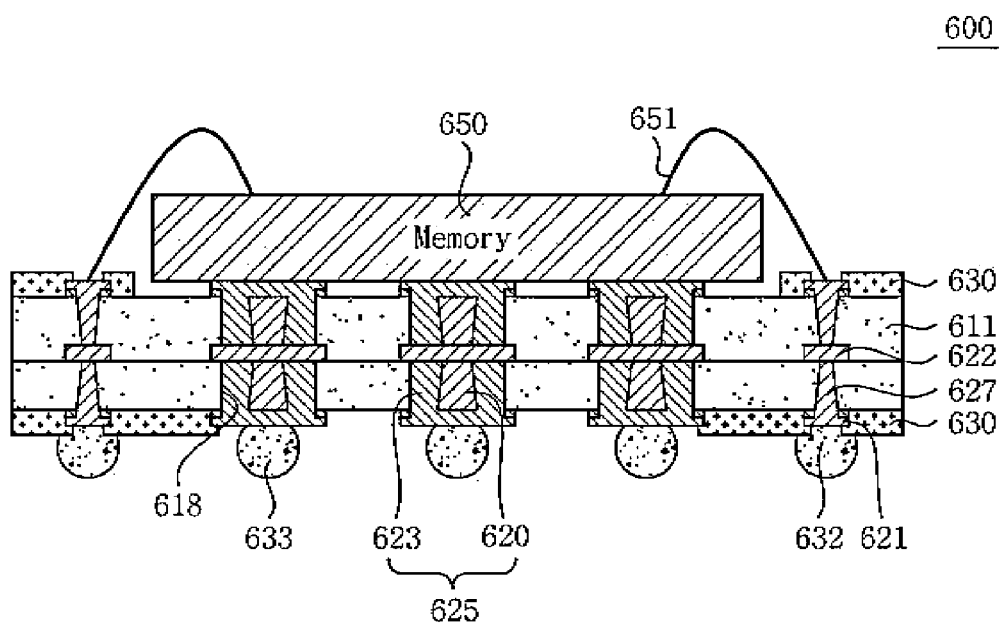
FIG. 43 is a cross-sectional view illustrating another example of an electronic module.

FIG. 43 is a cross-sectional view illustrating another example of an electronic module 600, and any redundant description of the identical or corresponding elements will not be repeated.

Referring to FIG. 43, the electronic module 600 includes a plurality of metal layers 621, 622 electrically insulated by a plurality of insulation layers 611 interposed in between the plurality of metal layers 621, 622, a via 627, a trench 618, and a heat-transfer structure 625 formed in the trench 618.

The via 627 is a signal via commonly formed for an interlayer electrical connection of circuit patterns.

The heat-transfer structure 625 is formed in the trench 618 penetrating the insulation layer 611 and has a greater volume that the via 627.

The heat-transfer structure 625 has a device 650 mounted thereon. The device 650 is bonded to a connection pad through a wire 651.

The heat-transfer structure 625 is constituted with a core 620 and an outer layer 623 surrounding outer surfaces of the core 620.

The insulation layers 611 has a solder resist layer 630 formed thereon for exposing a connection pad and as a protective layer of an outermost circuit pattern.

According to the present example, heat generated from the device 650 is efficiently discharged from the electronic module 600 through the heat-transfer structure 650.

Figure 44:
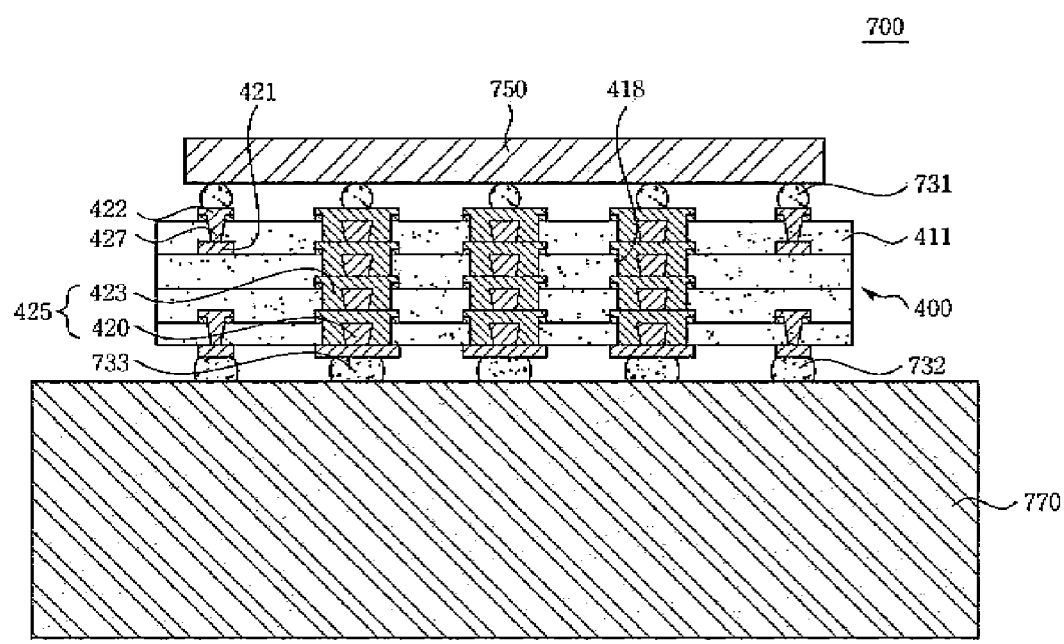
FIG. 44 is a cross-sectional view illustrating another example of an electronic module.

FIG. 44 is a cross-sectional view illustrating another example of an electronic module, and any redundant description of the identical or corresponding elements will not be repeated.

Referring to FIG. 44, a printed circuit board 400 having a device 750 mounted thereon is installed on a main board 770 by way of external connection terminals 732, 733.

The device is mounted on the printed circuit board 400 by using a solder bump 731 as a connector.

The printed circuit board 400 is formed with a plurality of metal layers 421, 422 electrically insulated by a plurality of insulation layers 411 interposed in between the plurality of metal layers 421, 422, a via 427, a trench 418, and a heat-transfer structure 425 formed in the trench 418.

The via 427 is a signal via commonly formed for an interlayer electrical connection of circuit patterns.

The heat-transfer structure 425 is formed in the trench 418 penetrating the insulation layer 411 and has a greater volume that the via 427.

The heat-transfer structure 425 has a laminated form of being laminated and connected in a vertical direction of the printed circuit board 400.

The heat-transfer structure 425 is constituted with a core 420 and an outer layer 423 surrounding outer surfaces of the core 420.

According to the present example, heat generated from the device 750 moves to a lower side of the printed circuit board 400 through the laminated form of the heat-transfer structure 425 embedded in the printed circuit board 400 and is ultimately displaced to an outside through the main board 770.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a plurality of insulation layers;
metal layers formed on the plurality of insulation layers;
a via formed for interlayer electrical connection of the metal layers;
a trench penetrating the insulation layers; and
a heat-transfer structure formed in the trench,
wherein the heat-transfer structure comprises a core disposed at a middle portion of the heat-transfer structure and an outer layer having at least a portion thereof being in direct contact with lateral surfaces of the core.

2. The printed circuit board as set forth in claim 1, wherein the heat-transfer structure has a rod shape.

3. The printed circuit board as set forth in claim 1, wherein the plurality of insulation layers each comprise a heat-transfer structure.

4. The printed circuit board as set forth in claim 1, wherein the at least one core and the outer layer each comprise at least one plating layer.

5. The printed circuit board as set forth in claim 1, wherein a volume of the heat-transfer structure is greater than a volume of the via.

6. The printed circuit board as set forth in claim 1, wherein a lateral surface of the heat-transfer structure is tilted so that the heat-transfer structure has a tapered shape.

7. An electronic module comprising:
a printed circuit board comprising a plurality of insulation layers, metal layers formed on the plurality of insulation layers, a via formed for interlayer electrical connection of the metal layers, a trench penetrating the insulation layers, and a heat-transfer structure formed in the trench; and
a device mounted on the printed circuit board,
wherein the heat-transfer structure comprises a core disposed at a middle portion of the heat-transfer structure and an outer layer having at least a portion thereof being in direct contact with lateral surfaces of the core.

8. The electronic module as set forth in claim 7, wherein the heat-transfer structure has a rod shape.

9. The electronic module as set forth in claim 7, wherein the device is mounted on the printed circuit board by being thermally connected with the heat-transfer structure.

10. The electronic module as set forth in claim 7, wherein the plurality of insulation layers each comprise a heat-transfer structure.

11. An electronic module comprising:
a printed circuit board comprising a plurality of insulation layers, metal layers formed on the plurality of insulation layers, a via formed for interlayer electrical connection of the metal layers, a trench penetrating the insulation layers, and a heat-transfer structure formed in the trench;
a device mounted on the printed circuit board; and
a main board on which the printed circuit board having the device mounted thereon is installed,
wherein the heat-transfer structure comprises a core disposed at a middle portion of the heat-transfer structure and an outer layer having at least a portion thereof being in direct contact with lateral surfaces of the core.

12. The electronic module as set forth in claim 11, wherein the heat-transfer structure has a rod shape.

13. The electronic module as set forth in claim 11, wherein the device is mounted on the printed circuit board by being thermally connected with the heat-transfer structure.

14. The electronic module as set forth in claim 11, wherein the plurality of insulation layers each comprise a heat-transfer structure.

15. A method of manufacturing a printed circuit board, comprising:
obtaining an insulation layer;
forming a via hole and a trench in the insulation layer;
forming a heat-transfer structure in the trench and a via in the via hole; and
forming a metal layer on the insulation layer,
wherein the forming of the heat-transfer structure comprises:
forming a core in the trench; and
forming an outer layer between an inner wall of the trench and the core, wherein at least a portion of the outer layer is in direct contact with lateral surfaces of the core.

16. The method as set forth in claim 15, wherein the obtaining of the insulation layer, the forming of the via hole and the trench, and the forming of the heat-transfer structure and the via are repeated such that each insulation layer includes a heat-transfer structure.

17. The method as set forth in claim 15, wherein the forming of the via hole and the trench comprises forming a rod-shaped opening in the insulation layer, and the via is formed by filling a first plating layer in the via hole;
the trench is formed in the insulation layer such that an outer surface of the first plating layer is exposed; and
the heat-transfer structure is formed by filling a second plating layer in the trench.

18. The method as set forth in claim 15, wherein a pattern having a rod-shaped opening for forming a core is formed, and the insulation layer is laminated in such a way that the pattern is embedded therein;
the via is formed by filling a first plating layer in the via hole;
the trench having a rod shape is formed in the insulation layer such that an outer surface of the pattern for core is exposed; and
the heat-transfer structure is formed by filling a second plating layer in the trench.

19. The method as set forth in claim 15, wherein the forming of the via hole and the trench comprises forming a rod-shaped trench in the insulation layer; and
the via and the heat-transfer structure are formed by forming two or more layers of patterned plating layers in the via hole and within the rod-shaped trench.

20. A method of manufacturing a printed circuit board, comprising:
forming a via and a core of a heat-transfer structure in an insulation layer;
removing a portion of the insulation layer surrounding the core to form a trench; and
filling the trench with a heat conducting material to form the heat-transfer structure.

21. The method as set forth in claim 20, wherein the removing of the portion of the insulation layer comprises removing the portion of the insulation layer surrounding the core by laser drilling as to expose an outer surface of the core.

22. The method as set forth in claim 20, wherein the heat-transfer structure has an elongated shape.

* * * * *